(12) United States Patent
Caspi et al.

(10) Patent No.: US 10,867,092 B2
(45) Date of Patent: Dec. 15, 2020

(54) AVOIDING ASYNCHRONOUS ENCLAVE EXITS BASED ON REQUESTS TO INVALIDATE TRANSLATION LOOKASIDE BUFFER ENTRIES

(71) Applicant: Intel Corporation, Santa Clara, CA (US)

(72) Inventors: Dror Caspi, Kiryat Yam (IL); Ido Ouziel, Ein Carmel (IL)

(73) Assignee: Intel Corporation, Santa Clara, CA (US)

( * ) Notice: Subject to any disclaimer, the term of this patent is extended or adjusted under 35 U.S.C. 154(b) by 310 days.

(21) Appl. No.: 15/844,529

(22) Filed: Dec. 16, 2017

(65) Prior Publication Data

US 2019/0042671 A1    Feb. 7, 2019

(51) Int. Cl.
*G06F 30/3323* (2020.01)
*G06F 9/46* (2006.01)
(Continued)

(52) U.S. Cl.
CPC ...... *G06F 30/3323* (2020.01); *G06F 12/0897* (2013.01); *G06F 12/1009* (2013.01);
(Continued)

(58) Field of Classification Search
CPC .... G06F 21/64; G06F 21/645; G06F 21/6218; G06F 30/3323; G06F 12/1027;
(Continued)

(56) References Cited

U.S. PATENT DOCUMENTS

| 4,231,086 A | 10/1980 | Tarbox et al. |
| 5,765,195 A | 6/1998 | McDonald |

(Continued)

FOREIGN PATENT DOCUMENTS

| BR | 102014006806 A2 | 12/2014 |
| CN | 104484284 B | 11/2017 |

(Continued)

OTHER PUBLICATIONS

Intel Corporation, "Intel® 64 and IA-32 Architecture Software Developer's Manual", Combined vols. 1, 2A, 2B, 2C, 2D, 3A, 3B, 3C, 3D, and 4, Oct. 2017, 111 pages.

(Continued)

*Primary Examiner* — Thai Q Phan
(74) *Attorney, Agent, or Firm* — Alliance IP, LLC

(57) ABSTRACT

Technologies are provided in embodiments including a memory element to store a payload indicating an action to be performed associated with a remote action request (RAR) and a remote action handler circuit to identify the action to be performed, where the action includes invalidating one or more entries of a translation lookaside buffer (TLB), determine that the logical processor entered an enclave mode during a prior epoch, perform one or more condition checks on control and state pages of the enclave mode, and based on results of the one or more condition checks, adjust one or more variables associated with the logical processor to simulate the logical processor re-entering the enclave mode. Specific embodiments include the remote action handler circuit to invalidate an entry of the TLB based, at least in part, on the results of the one or more condition checks.

25 Claims, 17 Drawing Sheets

(51) Int. Cl.
*G06F 9/455* (2018.01)
*G06F 12/1009* (2016.01)
*G06F 12/1027* (2016.01)
*G06F 12/0897* (2016.01)
*G06F 9/52* (2006.01)

(52) U.S. Cl.
CPC ......... *G06F 12/1027* (2013.01); *G06F 9/455* (2013.01); *G06F 9/46* (2013.01); *G06F 9/52* (2013.01); *G06F 2212/683* (2013.01)

(58) Field of Classification Search
CPC ...... G06F 12/1009; G06F 12/897; G06F 9/46; G06F 9/455
USPC ............... 703/22, 24, 26; 711/200, 205, 207
See application file for complete search history.

(56) References Cited

U.S. PATENT DOCUMENTS

| | | | |
|---|---|---|---|
| 6,336,179 | B1 | 1/2002 | Gulick |
| 6,539,470 | B1 | 3/2003 | Mahurin et al. |
| 7,178,062 | B1 | 2/2007 | Dice |
| 8,108,659 | B1 | 1/2012 | Grand |
| 8,543,772 | B2 | 9/2013 | Cota-Robles et al. |
| 8,549,285 | B2* | 10/2013 | Fink .................. H04L 29/12433 713/153 |
| 9,223,709 | B1 | 12/2015 | O'Bleness et al. |
| 9,430,384 | B2 | 8/2016 | Rozas et al. |
| 9,983,894 | B2* | 5/2018 | Horovitz ............ G06F 9/45545 |
| 10,193,868 | B2* | 1/2019 | Reubenstein ....... H04L 63/0281 |
| 10,216,662 | B2 | 2/2019 | Mishaeli et al. |
| 2002/0120800 | A1 | 8/2002 | Sugahara et al. |
| 2008/0010473 | A1 | 1/2008 | Harris |
| 2009/0125548 | A1 | 5/2009 | Moir et al. |
| 2010/0042824 | A1 | 2/2010 | Lee et al. |
| 2011/0047310 | A1 | 2/2011 | Bonola |
| 2011/0246727 | A1 | 10/2011 | Dice et al. |
| 2012/0117376 | A1* | 5/2012 | Fink .................. H04L 29/12433 713/153 |
| 2013/0159726 | A1* | 6/2013 | McKeen .................. G06F 21/72 713/189 |
| 2013/0191651 | A1 | 7/2013 | Muff et al. |
| 2013/0232344 | A1* | 9/2013 | Johnson .............. G06F 21/6218 713/193 |
| 2014/0181484 | A1 | 6/2014 | Callister et al. |
| 2014/0297962 | A1 | 10/2014 | Rozas et al. |
| 2015/0089173 | A1* | 3/2015 | Chhabra ............. G06F 12/1408 711/163 |
| 2015/0089502 | A1* | 3/2015 | Horovitz ............ G06F 9/45545 718/1 |
| 2015/0149815 | A1 | 5/2015 | Maity et al. |
| 2015/0186659 | A1* | 7/2015 | Leslie-Hurd ........ G06F 12/0875 726/1 |
| 2015/0370628 | A1* | 12/2015 | Zmudzinski ........ G06F 12/0882 711/133 |
| 2016/0371191 | A1 | 12/2016 | Rozas et al. |
| 2017/0091128 | A1 | 3/2017 | Mishaeli et al. |
| 2017/0286668 | A1* | 10/2017 | Shanahan ................. G06F 21/53 |
| 2017/0371803 | A1* | 12/2017 | Zmudzinski .......... G06F 12/145 |
| 2019/0095345 | A1* | 3/2019 | Zmudzinski .......... G06F 12/128 |
| 2019/0095357 | A1* | 3/2019 | Ozsoy .................... G06F 9/4403 |
| 2019/0196982 | A1* | 6/2019 | Rozas ..................... G06F 21/53 |

FOREIGN PATENT DOCUMENTS

| | | |
|---|---|---|
| CN | 108027726 A | 5/2018 |
| DE | 102014004563 A1 | 10/2014 |
| DE | 112015006952 | 6/2018 |
| GB | 2515611 A | 12/2014 |
| GB | 2522137 A | 7/2015 |
| GB | 2528796 B | 5/2016 |
| GB | 2534037 B | 10/2016 |
| JP | 2014203456 A | 10/2014 |
| JP | 5802290 B2 | 10/2015 |
| JP | 2016006681 A | 1/2016 |
| JP | 6344614 B2 | 6/2018 |
| KR | 100876488 B1 | 12/2008 |
| KR | 20140118862 A | 10/2014 |
| KR | 101628886 B1 | 6/2016 |
| TW | 201725507 A | 7/2017 |
| WO | 2011078855 A1 | 6/2011 |
| WO | 2017052669 A1 | 3/2017 |

OTHER PUBLICATIONS

Intel Corporation, Intel® Software Guard Extensions Programming Reference, Oct. 2014, 186 pages.
International Preliminary Report on Patentability for PCT Patent Application No. PCT/US20151056535 dated Mar. 27, 2018; 12 pages.
International Search Report and Written Opinion for PCT Patent Application No. PCT/US2015/056535 dated Jul. 26, 2016; 14 pages.
McKeen, Frank et al., "Intel® Software Guard Extensions (Intel® SGX) SGX2," Jun. 18, 2016, 31 pages.
USPTO, Final Office Action issued in U.S. Appl. No. 14/866,933, dated Oct. 30, 2017; 11 pages.
USPTO, Final Office Action issued in U.S. Appl. No. 15/250,787, dated Aug. 3, 2017; 20 pages.
USPTO, Final Office Action issued in U.S. Appl. No. 15/250,787, dated Aug. 9, 2018; 25 pages.
USPTO, Non-Final Office Action issued in U.S. Appl. No. 13/854,107, dated Apr. 22, 2015; 16 pages.
USPTO, Non-Final Office Action issued in U.S. Appl. No. 13/854,107, dated Dec. 9, 2015; 12 pages.
USPTO, Non-Final Office Action issued in U.S. Appl. No. 14/866,933, dated Mar. 1, 2018; 8 pages.
USPTO, Non-Final Office Action issued in U.S. Appl. No. 14/866,933, dated May 18, 2017; 7 pages.
USPTO, Non-Final Office Action issued in U.S. Appl. No. 15/250,787, dated Mar. 10, 2017; 15 pages.
USPTO, Non-Final Office Action issued in U.S. Appl. No. 15/250,787, dated Dec. 15, 2017; 19 pages.
USPTO, Notice of Allowance issued in U.S. Appl. No. 13/854,107, dated Jul. 22, 2016; 12 pages.
USPTO, Notice of Allowance issued in U.S. Appl. No. 14/866,933, dated Oct. 16, 2018; 8 pages.
USPTO: Non-Final Office Action issued in U.S. Appl. No. 15/250,787, dated Feb. 7, 2019; 22 pages.

* cited by examiner

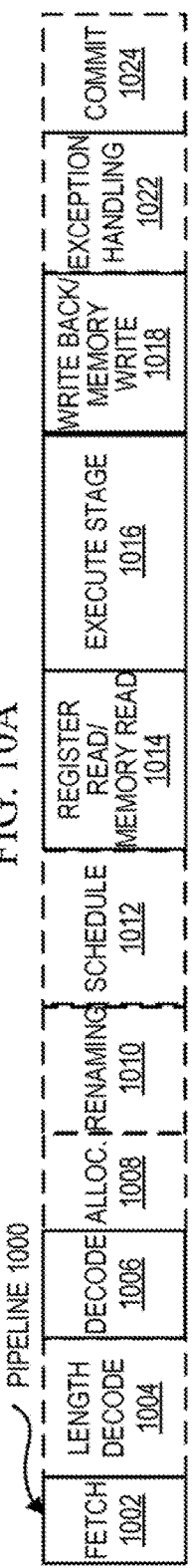
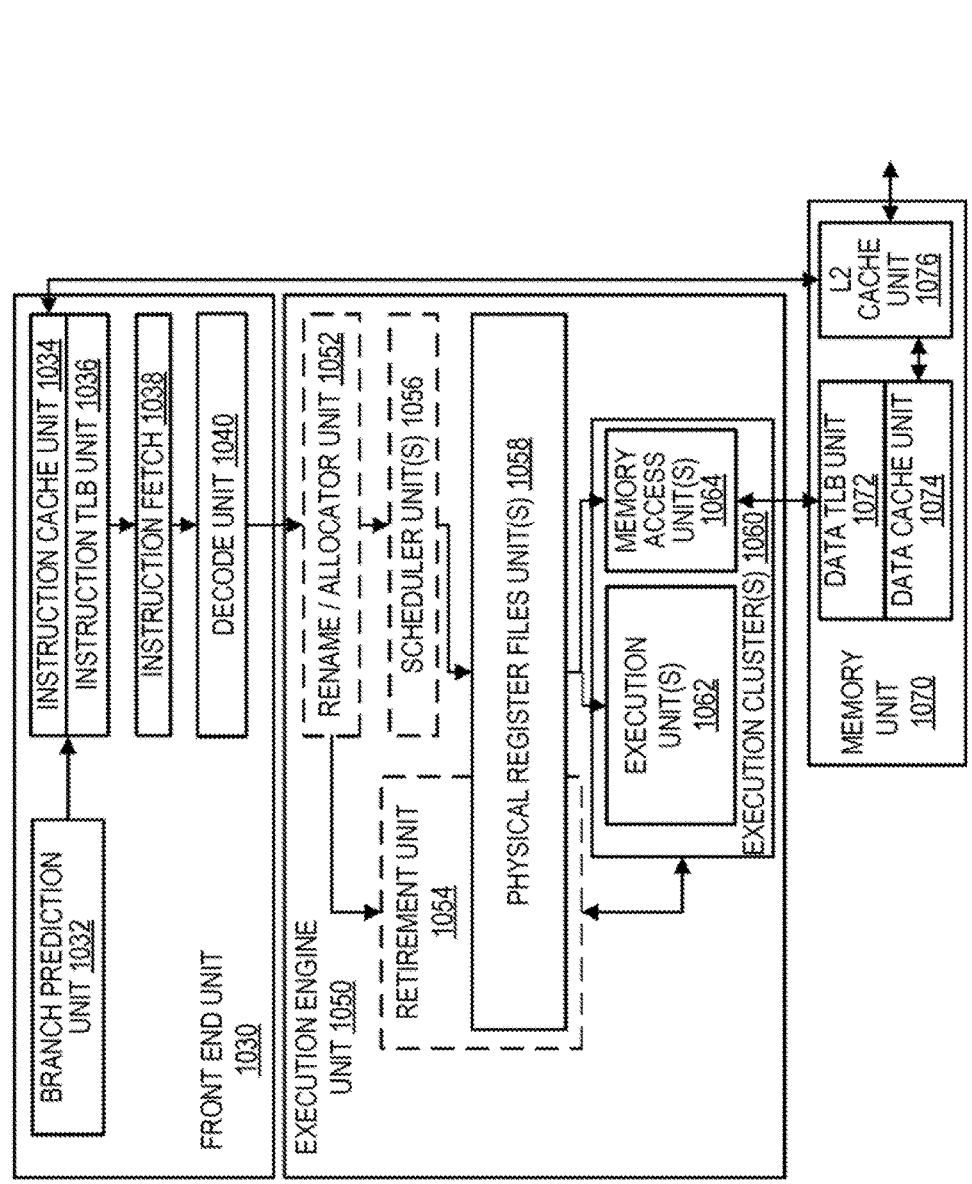
FIG. 10A
FIG. 10B

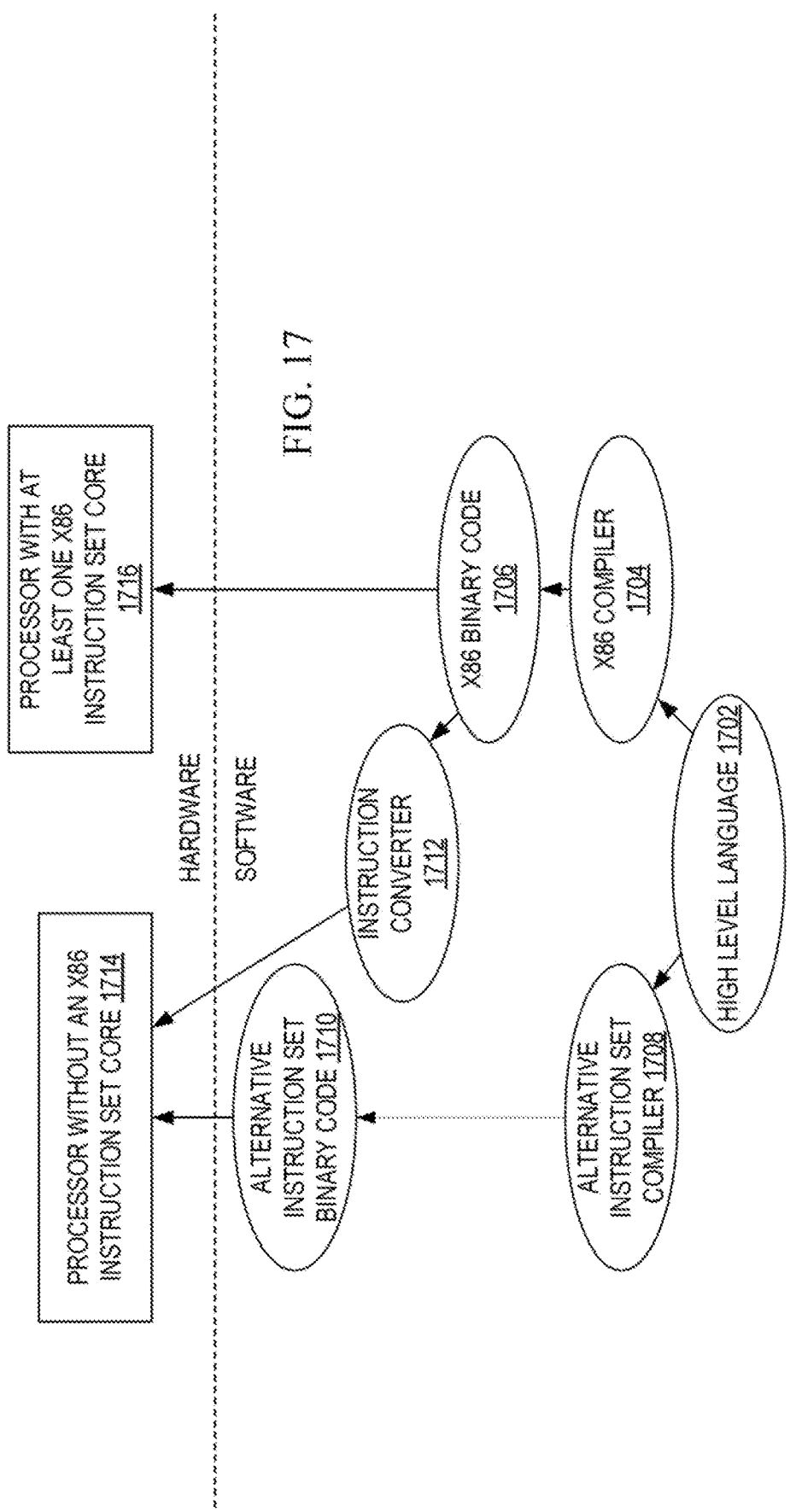

AVOIDING ASYNCHRONOUS ENCLAVE EXITS BASED ON REQUESTS TO INVALIDATE TRANSLATION LOOKASIDE BUFFER ENTRIES

TECHNICAL FIELD

This disclosure relates in general to the field of processing logic of microprocessors, and more particularly, avoiding asynchronous enclave exits based on requests to invalidate translation lookaside buffer (TLB) entries.

BACKGROUND

Data and code security in modern computer architectures is a significant concern, which has led to the development and use of techniques to create and maintain secure computing environments. A secure computing environment that protects selected code and data from inadvertent or malicious disclosure or modification is often referred to as a trusted execution environment (TEE). An example of a TEE is an enclave, which can be established as a protected area of execution in a process. Enclaves are isolated memory regions of code and data. Applications can use special central processing unit (CPU) instructions to create enclaves and to control entries into and exits from running in an enclave mode in which the isolated memory regions can be accessed. Thus, enclaves can be protected from other code that is not in the enclave.

In a trusted execution environment, the operating system may not be trusted to manage permissions, physical memory, and page table mapping changes. Ensuring security and integrity of private memory contents without trusting the operating system can result in significant overhead.

BRIEF DESCRIPTION OF THE DRAWINGS

To provide a more complete understanding of the present disclosure and features and advantages thereof, reference is made to the following description, taken in conjunction with the accompanying FIGURES, where like reference numerals represent like parts, in which:

FIG. 10A is a block diagram illustrating both an exemplary in-order pipeline and an exemplary register renaming, out-of-order issue/execution pipeline in accordance with certain embodiments;

FIG. 10B is a block diagram illustrating both an exemplary embodiment of an in-order architecture core and an exemplary register renaming, out-of-order issue/execution architecture core to be included in a processor in accordance with certain embodiments;

FIG. 17 is a block diagram contrasting the use of a software instruction converter to convert binary instructions in a source instruction set to binary instructions in a target instruction set in accordance with certain embodiments.

DETAILED DESCRIPTION OF EMBODIMENTS

Figure 1:
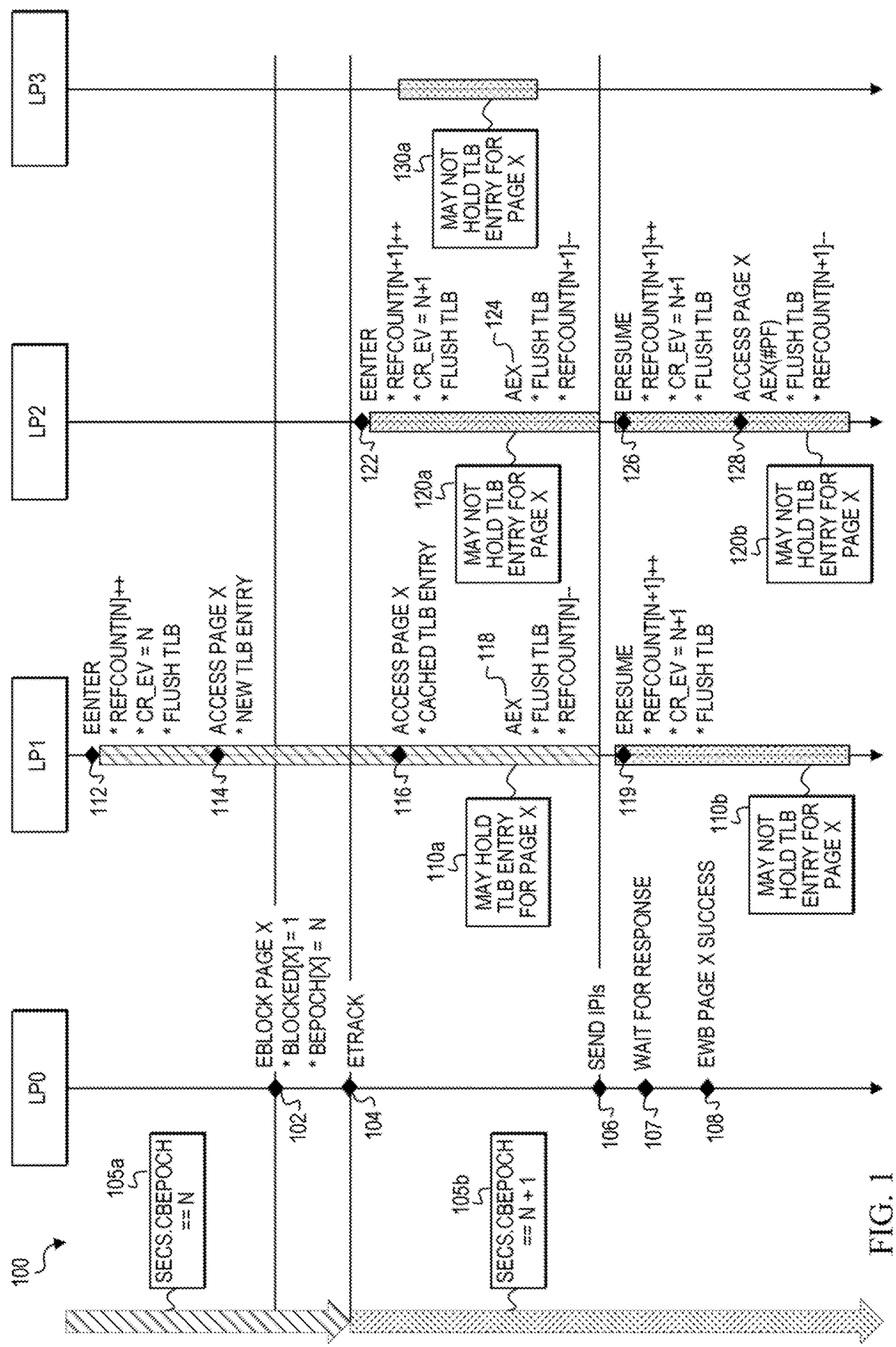
FIG. 1 is a simplified processing diagram illustrating one example of operations associated with tracking a translation lookaside buffer in an enclave.

The following disclosure provides various possible embodiments, or examples, of systems, methods, and apparatuses for implementing features for more efficiently protecting data and code in a trusted execution environment (TEE) such as an enclave. These features are related to avoiding asynchronous exits by logical processors running in an enclave mode, when remote action requests are received to invalidate translation lookaside buffer (TLB) entries associated with the logical processors. For purposes of illustrating certain example techniques for efficiently protecting data and code in a secure enclave, it is important to understand the activities that may be occurring in such systems in which data and code are accessed by a process running in an enclave mode. Accordingly, the following foundational information may be viewed as a basis from which the present disclosure may be properly explained.

In a trusted execution environment, a special cache can be provided for storing memory pages (also referred to herein as 'enclave pages') of private or protected code and/or data associated with the TEE. In one example, this special cache can be referred to as an enclave page cache (EPC). An enclave page may be a block of virtual memory that can be loaded into (or paged in) and evicted out of (or paged out of) the EPC to support a larger private or protected address space than the EPC can hold. To load a page of data and/or code into the EPC, the data and/or code may be accessed in a system (or main) memory or in non-volatile storage, decrypted, and then written to the EPC. To evict a page from the EPC, the data and/or code in the page may be re-encrypted and written back to system memory or to non-volatile storage (e.g., hard disk).

Access to pages stored in an EPC can be restricted to authorized processor cores, logical processors, and/or threads. A logical processor or core can run in an enclave (or 'run in an enclave mode') and perform memory accesses to the enclave memory area when its software thread is resident in the enclave memory area. One common processing technique for accessing data and code in an enclave page while running in an enclave mode is a translation lookaside buffer (TLB). A TLB is a memory cache used by a central processing unit (referred to herein as 'CPU' or 'processor') to cache translations of linear (or virtual) addresses to physical addresses in system memory, such as in an EPC. Whenever a CPU accesses system memory, it performs the address translation by, for example, looking up a page table in a process called a page walk. The translation is saved in a TLB. The translation can remain in the TLB until the TLB is full or until the translation is removed from the TLB (e.g., when an enclave page is being evicted from the EPC). An entry in a TLB may be associated with one logical processor running in an enclave at a particular time. If more than one logical processor has a translation of the same linear address, each logical processor is associated with its own TLB entry containing the translation of that linear address. Thus, memory regions corresponding to these entries are protected from unauthorized cores or logical processors.

When a process wants to evict a page from an enclave (e.g., in a trusted execution environment, such as Intel® Software Guard Extensions (Intel® SGX and Intel® SGX2), produced by Intel Corporation, of Santa Clara, Calif.), TLB tracking is used to ensure that no stale TLB entries are cached by any logical processor. A respective thread of a process may be running on each logical processor. If an enclave page is evicted in this scenario, then the CPU ensures that none of the threads has an ongoing reference to the evicted page. Otherwise, the thread could continue to read and/or write to the page even though the page does not belong to the enclave anymore. As a result, TLB tracking requires every logical processor running in an enclave to flush (also referred to herein as 'invalidate') enclave-context TLB entries by exiting the enclave mode and immediately resuming enclave mode execution. Because the page belongs to an enclave (i.e., in trusted execution environment), the CPU handles the tracking and flushing of the TLB entries, and the exiting and resuming by the logical processors. This can be accomplished by sending an inter-processor interrupt (IPI) or a remote action request (RAR) signal from one logical processor to other remote logical processors (RLPs) in a processor or core or cores to trigger a TLB shootdown and enclave exit by each receiving logical processor. TLB tracking with an IPI that triggers a software response on the RLP or an RAR signal that triggers a hardware response on the RLPs, however, incurs substantial overhead for enclave exit and resume operations.

For a more complete understanding of TLB tracking by a CPU, FIG. 1 provides a simplified processing diagram 100 illustrating one example of operations associated with tracking and flushing (or invalidating) TLB entries during paging in an Intel® SGX enclave environment using inter-processor interrupts or IPIs that invoke software. Before paging out an enclave page, the CPU ensures that no logical processor caches a TLB entry to that page. This is done in cooperation with the system software. The CPU tracks the process of flushing TLB entries that have accumulated for the page in TLBs associated with different logical processors before the page can be successfully removed from the enclave.

FIG. 1 illustrates four logical processors (LP0-LP3) in a CPU, three of which may run in an enclave of the CPU. Generally, a logical processor is a construct that executes a thread using hardware. Communication between logical processors in a system with multiple cores may be facilitated by an initiator logical processor (ILP) that sends communications (e.g., IPIs) to all the other processors. The receiving logical processors are referred to as remote logical processors or RLPs. In FIG. 1, LP0 is the designated ILP and LP1-LP3 serve as the RLPs, which may run in an enclave in this example.

The timeline of each enclave is defined by one or more epochs (i.e., time periods). When a page is evicted from an enclave, the timeline of the enclave may be defined by epochs that are generally relative to when the page is blocked (e.g., before being blocked, after being blocked). For each enclave, there is a global epoch variable, which is a counter (e.g., CBEPOCH) stored in a control structure (e.g., SECS) of the enclave. An SECS page may be stored in a dedicated enclave page cache (EPC) and may not be accessed by system software or the code in the enclave. Different values are assigned to the global epoch variable during different epochs. For example, each time the global epoch variable is incremented by one, a new epoch is defined during the enclave.

As shown in FIG. 1, a timeline of a paging out (or eviction) process in an enclave is divided into epochs 105a and 105b. The global epoch variable (or counter) can start at 0, for example, and be incremented by an enclave tracking (ETRACK) instruction that is performed in response to certain events. In this example, the global epoch variable starts with a value equal to N during the first epoch 105a. LP1 enters the enclave during this epoch 105a.

When an enclave page is blocked, an ETRACK instruction is performed on a logical processor to advance the epoch by incrementing the global epoch variable to N+1. The global epoch variable divides the timeline so that events occurring before the ETRACK instruction is performed and after the ETRACK instruction is performed can be used to understand whether TLB entries to pages within the enclave might exist. In addition, for each enclave, reference counters can be used to keep track of the number of logical processors running during the current and previous epochs, based on entries into the enclave and exits from the enclave. Furthermore, for each logical processor running in the enclave, the epoch at the time of enclave entry for that logical processor is recorded, for example, in an enclave entry epoch variable (e.g., CR_EV variable).

In the example of FIG. 1, LP1 enters the enclave (also referred to herein as entering the 'enclave mode') at an enclave enter (EENTER) instruction 112 and accesses an enclave page, PAGE X, at 114. This access can be done by any instruction performed while LP1 runs in the enclave mode. In this example, PAGE X includes protected or private data or code that is accessible only by logical processors running within the enclave. Accordingly, address translation is performed for PAGE X and the address translation is stored in an entry of a TLB associated with LP1. Subsequent accesses to PAGE X (e.g., at 116) do not require translation of the linear address to the physical address because LP1 can use the cached TLB entry of its associated TLB to access PAGE X in an enclave page cache. Also at 112, an enclave entry epoch variable (e.g., CR_EV) is updated. The CR_EV variable is associated with LP1 and is the enclave epoch value sampled when the enclave is entered by LP1 at 112 (or when the enclave is re-entered using ERESUME instruction).

When an enclave page needs to be paged out (or evicted), for example, to make the evicted page available to possibly another enclave, then software of an initiator logical processor (ILP) issues an enclave block (EBLOCK) instruction on the target enclave page. The EBLOCK instruction marks a bit referred to as a 'blocked bit.' The blocked bit is set to 1, which prevents any new TLB translations to the target enclave page by any logical processors. Although new TLB translations for the page are blocked, previous translations for the page may still be held in TLB entries of one or more logical processors. In addition, the blocked bit also prevents a logical processor from accessing the enclave page for the first time (i.e., where the TLB of the logical processor does not already have a TLB entry with a translation for the enclave page). The EBLOCK instruction also records, at the time the EBLOCK instruction is executed, the enclave's epoch value in a special variable (e.g., BEPOCH variable) that is associated with the target enclave page.

As shown in FIG. 1, when PAGE X needs to be paged out, LP0 issues an EBLOCK instruction 102 on PAGE X. LP0 sets the blocked bit to 1 (e.g., BLOCKED[X]=1) and also records the enclave's epoch value as N (e.g., BEPOCH [X]=N).

Subsequent to issuing the EBLOCK instruction, the ILP issues an ETRACK instruction on the enclave. The ETRACK instruction advances the enclave's epoch by incrementing the epoch variable by one. This sets a time boundary between a first time period (or previous epoch) that is prior to the ETRACK instruction being issued and a second time period (or current epoch) that is subsequent to the ETRACK instruction being issued.

As shown in FIG. 1, LP0 issues an ETRACK instruction 104. As shown at 105*b*, the ETRACK instruction causes the epoch to advance by incrementing the epoch variable to N+1.

Next, an enclave exit is forced on all logical processors. This can be done by issuing, from the ILP to the RLPs in the system, an inter-processor interrupt (IPI). When an interrupt in the form of an IPI is sent from one processor to others, in some scenarios, the request may be handled by the software at an RLP. In other scenarios, a request may be handled by microcode at an RLP. A remote action request (RAR) signal could force an enclave exit using microcode on an RLP. When a signal in the form of an RAR is sent from one processor to others, the request is handled internally by the CPU microcode without needing to exit to software. Currently, both a RAR signal and an IPI received by an RLP cause an Asynchronous Exit (AEX) to be performed by the RLP. The TLB entries in each TLB associated with the RLPs can be flushed during the AEX routines to prevent the CPU from accessing the target enclave page once it is removed from the enclave. A reference counter of the epoch associated with the RLP is also decremented to indicate a count of the number of logical processors in that epoch that are running in the enclave.

As shown in FIG. 1, LP0 issues an IPI at 106 to each of the remote logical processors, LP1, LP2, and LP3, and then waits for a response at 107. In this example, when the IPI is issued at 106, only LP1 and LP2 are running in the enclave. LP1 entered the enclave at 112, in epoch N. LP2 entered the enclave at 122, in epoch N+1. LP3 has not entered the enclave and thus, is not running in the enclave. In response to the IPI received from LP0, LP1 performs an AEX operation at 118 to exit the enclave. In response to the IPI received from LP0, LP2 performs an AEX operation at 124 to exit the enclave. LP1 and LP2 each flush their respective TLB entries to prevent the CPU from accessing PAGE X when LP1 and LP2 are not running in the enclave mode. For LP1, a reference counter of the prior epoch N (e.g., REFCOUNT[N]) is decremented to indicate the current number of logical processors in epoch N that are running in the enclave. For LP2, a reference counter of the current epoch N+1 (e.g., REFCOUNT[N+1]) is decremented to indicate the current number of logical processors in epoch N+1 that are running in the enclave.

It should be noted that after the ETRACK is issued and before the IPI is issued, the TLBs of the logical processors may vary with respect to which ones hold a TLB entry for PAGE X. LP1 is still associated with epoch N before the IPI is issued. Because LP1 entered the enclave and accessed PAGE X in epoch N, the TLB associated with LP1 may hold a TLB entry for PAGE X as indicated at 110*a*. LP2 did not enter the enclave until epoch N+1. Therefore, any subsequent attempts to access PAGE X would be blocked and so its associated TLB may not hold a TLB entry for PAGE X. Similarly, LP3 has not entered the enclave at all in FIG. 1. Accordingly, the TLB associated with LP3 may not hold a TLB entry for PAGE X. Once the IPI is issued, all TLBs are flushed. Accordingly, the TLBs of LP1, LP2, and LP3 may not told TLB entries for PAGE X.

Normally, an RLP resumes enclave execution following its asynchronous exit from the enclave. In FIG. 1, LP1 and LP2 each perform an ERESUME instruction at 119 and 126, respectively. The TLBs associated with LP1 and LP2 are flushed. In addition, the reference counter of the current epoch N+1 is incremented for each logical processor, e.g., LP1 and LP2, performing the ERESUME instructions.

Once the logical processors re-enter the enclave, subsequent attempted accesses to PAGE X may result in a page fault and another asynchronous exit. As shown in FIG. 1, at 128, LP2 attempts to access PAGE X. A page fault occurs, the TLB is flushed, and a reference counter is decremented by 1 to indicate the total number of logical processors running in the enclave.

Software of the ILP issues an enclave write-back (EWB) instruction on the target enclave page. The EWB instruction specifies the address of the target enclave page as an operand in order to complete the eviction. The EWB instruction uses the global epoch variable, reference counters, and the epoch recorded by the EBLOCK instruction to ensure that the tracking process has been correctly executed. Once it is confirmed that the tracking process has been correctly executed, the eviction is completed by encrypting the target enclave page, writing the encrypted page back to main memory (outside of the enclave), and removing the target enclave page from the EPC.

In FIG. 1, LP0 issues an EWB instruction on PAGE X, which confirms that the tracking process was correctly executed. Based on the tracking process being confirmed as a success, PAGE X is re-encrypted, written back to main memory or non-volatile storage, and removed from the enclave by deleting it from the EPC.

An asynchronous exit operation and subsequent enclave resume instructions described above perform additional operations resulting in substantial inefficiencies and wasted clock cycles. For example, the internal state of the processor is saved to memory because the state might contain secrets that are protected when running in the enclave. Thus, an AEX operation preserves the processor's architectural state in enclave pages known as State Save Area (SSA). The AEX operation also loads a synthetic state, restore debug mechanisms suppressed during the enclave run, and resume non-enclave execution. The ERESUME instructions are performed so that the logical processor can continue executing in the protected area of memory. The ERESUME instructions perform multiple verifications, restore the state from SSA, suppress debugging mechanisms, and set the hardware for running the enclave mode. Such operations require an overhead involving thousands of clock cycles.

Figure 2:
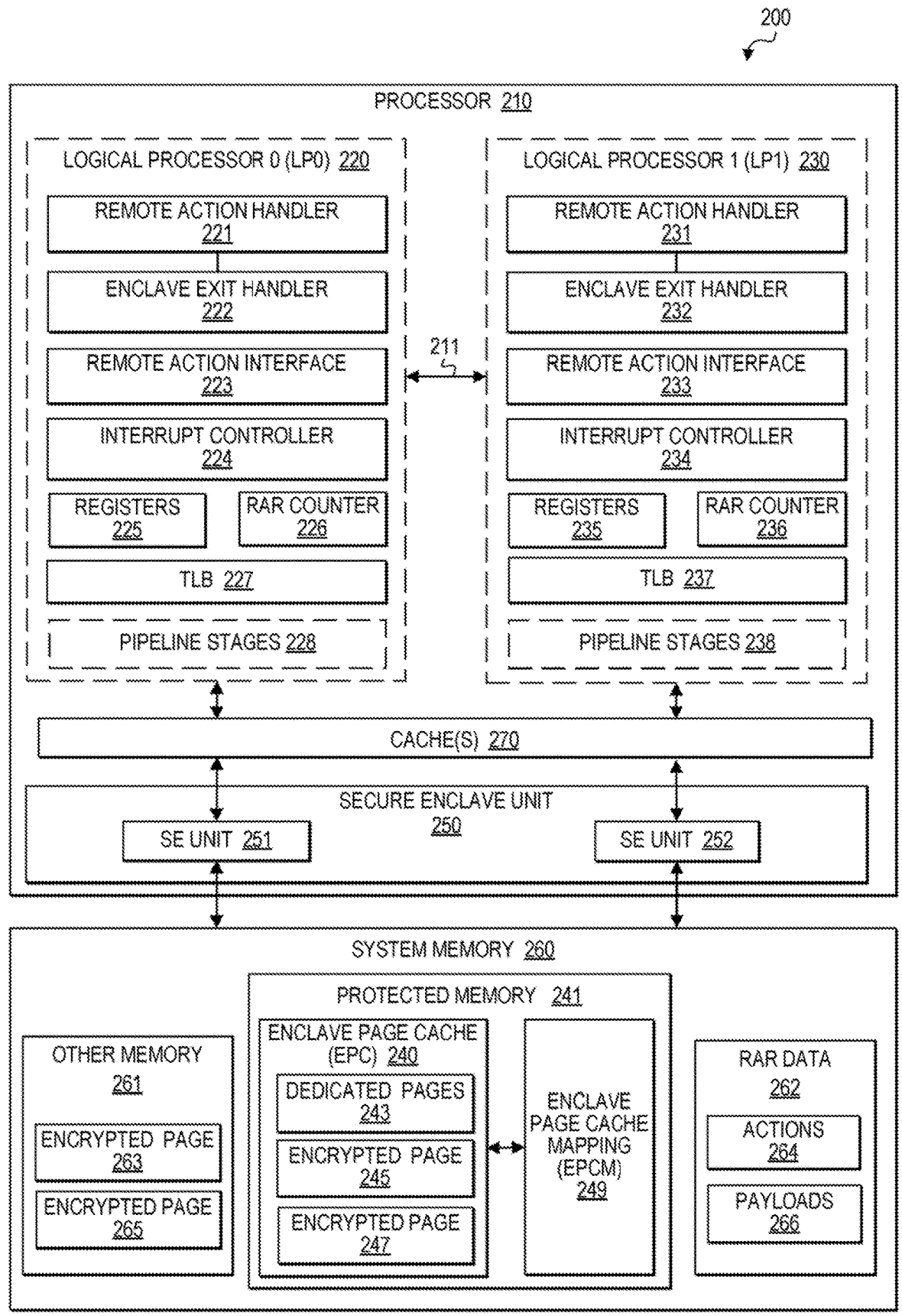
FIG. 2 is a simplified block diagram of a computing system for avoiding asynchronous exits based on requests to invalidate translation lookaside buffer (TLB) entries in accordance with certain embodiments.

Turning to FIG. 2, embodiments of a computing system 200 configured for avoiding asynchronous enclave exits based on requests to invalidate translation lookaside buffer (TLB) entries can resolve the aforementioned issues (and more) associated with evicting pages of protected data or code from an enclave. When a page of protected data or code is being evicted from an enclave, embodiments of computing system 200 described herein can perform TLB tracking without requiring, in most cases, a logical processor to exit from the enclave (e.g., via an asynchronous exit). A request to invalidate a TLB entry for an enclave page may be communicated in the form of a remote action request (RAR) interrupt or signal to logical processors in a system as part of evicting the page from the enclave. Certain logical processors that are running in the enclave and that receive the request may avoid an asynchronous exit from the enclave by invalidating the TLB entries corresponding to enclave pages and adjusting TLB tracking state of the logical processor. These actions may be taken in response to successful condition checks performed on control and state pages associated with the enclave.

One example request to invalidate a TLB entry can be initiated by a logical processor (referred to herein as an 'initiator logical processor' or 'ILP') in the system and sent to all other logical processors (referred to herein as 'remote logical processors' or 'RLPs') in the system. RLPs can include any logical processor in the same core with the ILP or in other cores. The ILP sets up a payload in memory according to a consistent format and then issues a remote action request to the relevant RLPs either by sending an inter-processor interrupt (IPI) vector (referred to herein as 'RAR interrupt') to the RLPs through an interrupt command register (ICR) or by a dedicated signaling mechanism. An RLP handles a remote action request using remote action request handler (RARH) hardware and/or a remote action interface hardware, which interrupts a normal execution flow of operations in the RLP, but does not present the handling to software. After detecting the request, the RLP reads the payload from memory and performs the requested action without software involvement. After completing the action, the RLP notifies the ILP of its success/failure. This notification may be done by writing to a location in memory, or by sending a new dedicated signal to a counter in the ILP that collects acknowledgements from all RLPs.

A computing system that minimizes asynchronous exits while evicting pages from an enclave can provide several advantages. Current techniques for evicting pages from an enclave typically incur a large overhead for enclave exit and resume operations. In particular, asynchronous exit and resume operations for a logical processor can result in thousands of clock cycles each time an enclave page is evicted. Embodiments of computing system 200 described herein can improve the performance of running in a trusted execution environment, such as an enclave, by eliminating most enclave exit and resume operations that are the result of system processes not under enclave writer control. Embodiments herein provide for performing enclave exit and resume operations on an as-needed basis according to whether control and state pages of an enclave remain implicitly available (e.g., unmodified, unblocked, and otherwise accessible) to the logical processors.

In FIG. 2, computing system 200 includes a processor 210 and a system memory 260. Processor 210 comprises a plurality of logical processors including, but not necessarily limited to logical processor 0 (LP0) 220 and logical processor 1 (LP1) 230. Each logical processor may run a software thread of a process and, in at least some embodiments, the software threads may be executed concurrently by alternating pipeline stages 228 and 238. The logical processors 220 and 230 are associated with at least one hardware unit for executing instructions, e.g., in pipeline stages 228 and 238. The logical processors 220 and 230 may communicate via interfaces, such as remote action interfaces 223 and 233, respectively, using one or more buses/interconnects 211. Logical processors 220 and 230 may be provisioned in the same core or in separate cores, and may share some physical resources and/or circuitry. Shared physical resources may include, for example, system memory 260 and one or more enclave page caches (EPCs) 240, which can be in a protected area of system memory 260, such as protected memory 241, in at least one implementation. Shared circuitry may include one or more secure enclave (SE) units 250. In addition, one of the logical processors (e.g., LP0 220) may serve as an initiator logical processor (ILP) that sends RAR interrupts or signals to remote logical processors (e.g., LP1 230) in the system to cause the RLPs to perform certain actions such as invaliding TLB entries.

In at least one embodiment, EPC 240 may reside system memory 260. In one example, system memory 260 may be dynamic random access memory (DRAM), which cannot be directly accessed by software, including system software. EPC 240 may be provisioned in a protected (e.g., encrypted) memory area 241 of system memory 260 and may be used to securely store data and code for shared page addresses allocated to a secure enclave and accessible by logical processors 220 and 230. Enclave page cache mapping (EPCM) 249 may also reside in the protected area of system memory 260. EPCM 249 maps to protected code and data in the EPC pages (e.g., encrypted pages 245, 247). In at least some embodiments, control and state pages for an enclave may be stored as dedicated EPC pages 243 (e.g., SGX enclave control structure (SECS) page, thread control structure (TCS) page, state save area (SSA) page), which may also be encrypted. In at least one embodiment, EPC 240 may be part of a larger cache unit, such as one or more level-one caches 270 or a level-two cache (not shown). In other embodiments, EPC 240 may be a separate structure or distributed structure, which may be shared by one or more logical processors. In a further embodiment, EPC 240 may be part of a special on-chip memory, such that enclave pages may not have to be encrypted when stored in the EPC.

System memory 260 can also store data and code pages in an area of system memory that is unprotected, such as other memory 261. Data and code stored in the other memory area can include encrypted pages, such as encrypted pages 263 and 265, which may be accessible to logical processors running in an enclave to be paged in to or out of EPC 240. System memory 260 can further store RAR data 262, which can include a data structure of actions 264 to be performed and a data structure of action payloads 266. In at least one embodiment, the actions data structure 264 may be a table, although any other suitable data structure, such as dedicated registers, may be used instead. The table may include a column per action with each row corresponding to an RLP. Entries in the table can indicate a status of a particular action with respect to the RLP. Example statuses include pending, success, or failure. The actions data structure 264 may be programmed by the ILP, read by an RLP, cleared by the RLP, and then read by the ILP.

Payloads data structure 266 may be a table, although any other suitable data structure, such as dedicated registers, may be used instead. The table may include a column to indicate if a payload is valid (i.e., not complete) and a column for the payload itself (or a pointer to the payload) per action. The payload may include a request and an address associated with the request. In one example, the payload may include a request to invalidate a translation lookaside buffer (TLB) entry for an enclave page and an address of the enclave page, where the address is stored in the TLB entry of the TLB (e.g., 227 or 237). An invalidate TLB entry request can cause a receiving RLP to invalidate any TLB entry associated with the targeted page (e.g., TLB entry containing a linear and/or physical page address of the targeted page). The payloads data structure may be programmed by the ILP, read by an RLP, and cleared by the ILP. Although the actions data structure 264 and the payloads data structure 266 are shown in system memory 260 in FIG. 2, it should be apparent that one or both of these data structures may be stored in any other suitable shared memory (e.g., shared cache, etc.) or may be encrypted and stored in another area of system memory or another memory element.

Processor 210 may comprise secure enclave (SE) unit 250. SE unit 250 may comprise a separate structure or distributed structure (e.g., SE units 251 and 252) shared by multiple logical processors 220 and 230. In at least one embodiment, SE unit 250 may include encryption units, integrity protection units, access control units, range registers, and two or more epoch counters. The epoch counters can include a current epoch counter to record a number of logical processors (or threads) running in the current epoch of the secure enclave, and a most recent previous epoch counter that records the logical processors (or threads) associated with the most recent previous epoch. SE unit 250 may also support enclave instructions to provide advanced paging capabilities for secure enclave page caches (e.g., 240).

Logical processors 220 and 230 may comprise interrupt controllers 224 and 234, respectively, which prioritize, decode, and cause exceptions and interrupt vectors to be sent. Example interrupt controllers include, but are not necessarily limited to, Advanced Programmable Interrupt Controllers (APICs), Generic Interrupt Controllers (GICs), and MultiProcessor Interrupt Controllers (MPICs). Interrupt controllers 224 and 234 may be input/output (I/O) or local interrupt controllers.

These interrupt controllers 224 and 234 provide interprocessor interrupts (IPIs) that allow processors to interrupt another processor or set of other processors. In some embodiments, an IPI is generated by a logical processor writing to a register, such as an interrupt command register or software interrupt register associated with its interrupt controller. The register stores an interrupt vector and an identification of the target processor (in some embodiments, an interrupt controller ID is used). A message is then sent via an interrupt bus to the target interrupt controller which then issues the interrupt to its processor for handling (for example, invoking a remote action handler).

Generally, a translation lookaside buffer is a memory cache that stores recent translations of virtual memory to physical addresses for faster retrieval. Logical processors 220 and 230 may comprise respective TLBs 227 and 237 in which translations of virtual, logical, or linear addresses to physical addresses may be stored to access EPC 240. In some embodiments, these TLBs 227 and 237 are separate caches. In other embodiments, a single TLB cache is logically partitioned among the logical processors.

A plurality of registers 225 and 235 (in addition to typical general purpose registers, floating point registers, status registers, etc.) per processor may be used to support remote action request handlers. One register that may be used is an interrupt command register or software interrupt register. Depending upon the implementation, the plurality of registers 225 and 235 also include: i) a register to store a specific interrupt vector that denotes hardware-based action handling called a Remote Action Request (RAR) interrupt; ii) a register to store a memory location of a payload(s) which contain(s) request information for possible concurrent requests; and/or iii) a register to store a memory location of a list of action requests for RLPs. In some embodiments, the memory location holds a table of action requests. Examples of payloads include, but are not limited to, a remote action request to: 1) invalidate an entire (remote) TLB (instead of a single entry of the TLB); 2) invalidate a single entry of a (remote) TLB; 3) invalidate one or more entries of a (remote) TLB that correspond to one or more pages included in a specified set of pages; and/or 4) perform no action. The registers 225 and 235 may also include storage for a few characteristics of the RAR feature such as: interrupt vector, Payload and Action Memory Resident Table Sizes, Max Payload Type, etc.

Remote action interfaces 223 and 233 may be implemented as circuitry including microcode that receives a signal related to a RAR that does not use IPI signaling, reads the payload of the signal, performs the requested action, and acknowledges the request. For example, a RAR initiated on an ILP causes a signal to be received by the remote action interface of the RLP that handles the RAR. Performance of the action may be done by calling one or more hardware handlers, such as remote action handlers 221 and 231. In at least one embodiment, software is not involved in the handling of the RAR by the remote action interfaces 223 and 233. Remote action interfaces 223 and 233 may also perform actions with respect to clearing a payload from a payload data structure.

Remote action handlers 221 and 231 may be implemented as circuitry including microcode that identifies a RAR, performs the requested action of the RAR, and signals acknowledgment to the ILP. In at least one embodiment, software is not involved in the handling of the RAR by the remote action handlers 221 and 231. Remote action handlers 221 and 231 may also perform actions with respect to polling an action data structure and clearing a payload from a payload data structure.

Enclave exit handlers 222 and 232 may be implemented as circuitry including microcode that performs enclave exit processing, which can include invoking enclave mode handling. Enclave mode handling can include performing condition checks on control and state pages of the enclave, performing an asynchronous exit if any of the condition checks fail, invalidating TLB entries associated with the enclave if the condition checks pass, and adjusting the TLB tracking state if the condition checks pass. Adjusting the TLB tracking state can include adjusting one or more variables associated with the RLP such as an enclave entry epoch and enclave reference counters. In at least one embodiment, enclave exit handlers 222 and 232 may be implemented as part of the handling of a RAR. For example, exclave exit handlers 222 and 232 may be implemented as an addition to (e.g., integrated with) remote action handlers 221 and 231, respectively. In other embodiments, enclave mode handlers may be separate from, but called or otherwise initiated by, their respective remote action handlers. In at least one embodiment, software is not involved in the handling of the RAR by the enclave exit handlers 222 and 232.

Enclave exit handlers 222 and 232 may also perform actions to determine whether enclave mode handling is to be performed. The determination of whether enclave mode handling is to be performed can be made after the requested TLB entries are invalidated based on the received RAR interrupt or signal. These actions can include determining whether the RLP is running in an enclave mode and whether the TLB entries to be invalidated correspond to enclave pages (i.e., pages within an enclave address range). Determining whether the RLP is running in an enclave mode may be accomplished by evaluating a flag that is set if the RLP is currently running in the enclave mode Determining whether the invalidated TLB entries correspond to enclave pages may be achieved by comparing page addresses specified in a payload of the RAR interrupt or signal to the enclave linear address range. If at least one page address in the payload is within the enclave linear address range and if it is determined that the RLP is running in an enclave mode, then enclave mode handling can be performed.

Enclave mode handling can include determining whether the RLP entered the enclave during the current enclave epoch. This determination can be performed by comparing a current value of a global epoch variable and a current value of an enclave entry epoch variable associated with the RLP. If the values are equivalent, then the RLP entered the enclave during the current enclave epoch.

Enclave mode handling includes further processing if it is determined that the RLP did not enter the enclave during the current epoch (e.g., if the RLP entered the enclave mode during the immediately prior epoch). In this scenario, one or more condition checks can be performed to determine if an asynchronous exit needs to be performed or if the running enclave can be switched to the current epoch without forcing the RLP to exit and re-enter the enclave. Condition checks are performed on control and/or state pages of the enclave. A control page is created for a thread of a process to be run in an enclave mode on a logical processor. The control page can include meta information about the thread (e.g., address of thread starting point, thread local storage, state storage area information, etc.). A state page is an area where context (e.g., processor state) information is stored when the context switches. Examples of context switches include exiting events such as exceptions, interrupts, system management interrupts (SMIs), and virtual machine (VM) exits. In one example, the control page is referred to as a thread control structure (TCS) page and the state page is referred to as a state save area (SSA) page. In at least one embodiment, the TCS page and SSA page(s) may be stored in respective, dedicated EPC pages, represented by dedicated pages 243 of EPC 240.

Conditions that are checked in enclave mode handling include whether a control page or state page(s) has been blocked, modified, or otherwise made inaccessible to the logical processor. In this example, these pages are required to be implicitly available while the logical processor is running in the enclave mode. If any of the pages have been blocked, modified or otherwise made inaccessible, then the page is no longer implicitly available to the logical processor running in the enclave. Specific condition checks that indicate none of the control or state pages has been blocked, modified, or otherwise made inaccessible include (1) confirming that a linear address to physical address translation has not changed since it was last checked during the enclave entry by the logical processor, (2) confirming that the page has read and write access permissions in the operating system page tables, (3) confirming that, in the page EPCM entry, the page type is correct (e.g., PT_TCS for TCS pages, PT_REG for SSA pages), (4) confirming that, in the page EPCM entry, SSA pages are marked as readable and writeable, and (5) confirming that, in the page EPCM entry, a blocked bit is not marked (e.g., not set to 1), and (6) confirming that, in the page EPCM entry, a modified bit is not marked (e.g., not set to 1). If any of these condition checks is not confirmed, then that condition check fails.

If any one of the condition checks fail, then the RLP cannot continue to run in the enclave mode and an asynchronous exit is performed. If none of the condition checks fail, however, then the TLB entries associated with the enclave context are invalidated, and one or more variables associated with the logical processor running in the enclave mode are adjusted. In at least one embodiment, the variables associated with the logical processor running in the enclave mode include an enclave entry epoch variable and one or more enclave reference counters. The enclave entry epoch variable for the RLP is adjusted to be equal to the current value of the global epoch variable, and the enclave reference counters are adjusted as if the RLP just re-entered the enclave. Adjusting these variables simulates the RLP re-entering the enclave mode as if an asynchronous exit operation had been performed and an instruction to re-enter the enclave mode (e.g., ERESUME instruction) was subsequently executed. Accordingly, the RLP can continue running in the enclave mode without requiring the actual execution of an asynchronous exit and subsequent re-entry into the enclave mode.

It will be apparent that while processor 210 is illustrated, for simplicity, as having a particular number of components, the broad scope of this disclosure is not intended to be so limited and that computing system 200 may include more (or less) components in various implementations. For example, additional logical processors may be included in processor 210, and processor 210 may include one or more cores that each contain one or more logical processors. In addition, some computing systems 200 may be implemented as a multi-socketed system. In another example, various components that include microcode (e.g., remote action interfaces 223 and 233, remote action handlers 221 and 231, and enclave exit handlers 222 and 232) may be integrated, combined, partitioned, or separated in any suitable configuration based on particular needs and implementations.

Figure 3:
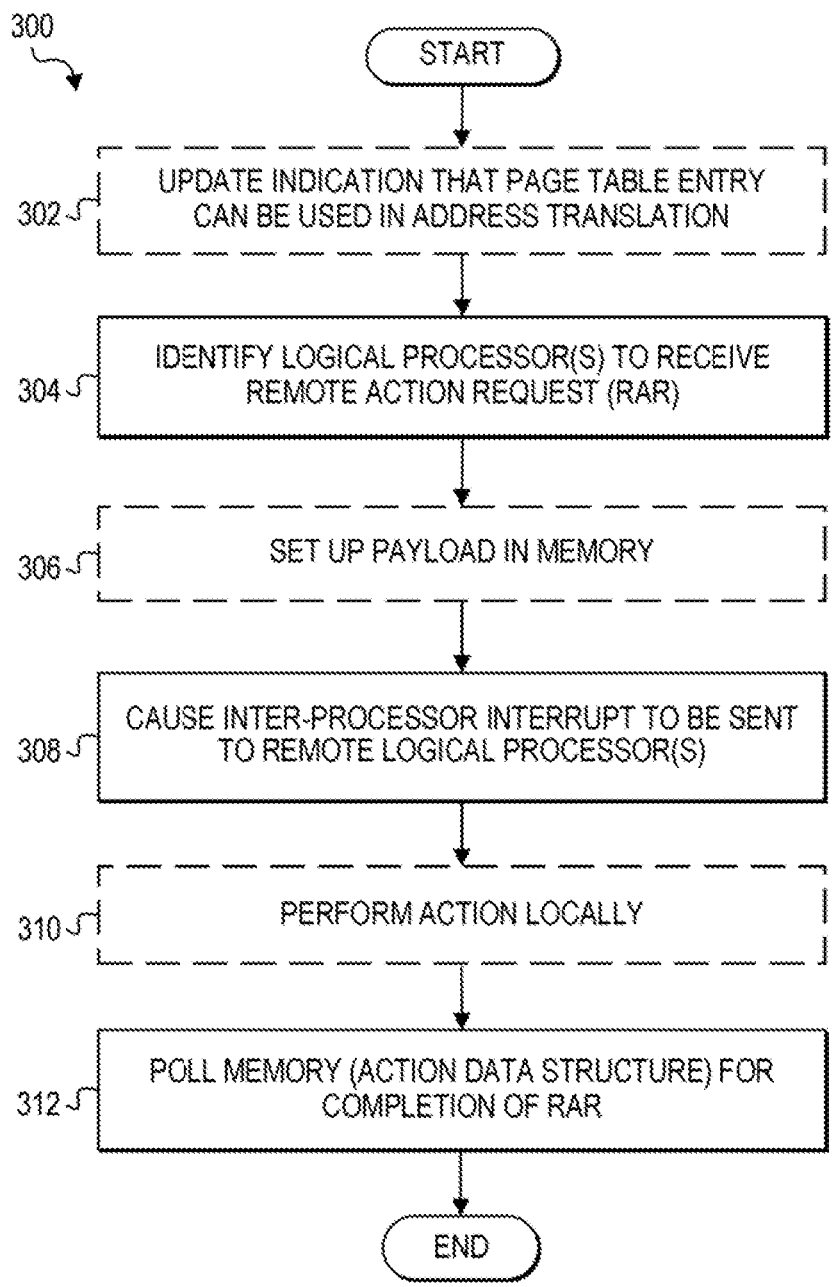
FIG. 3 is a simplified flowchart of potential operations associated with initiating remote action requests in accordance with certain embodiments.

FIG. 3 is a simplified flowchart 300 that illustrates possible operations that may be associated with an embodiment of computing system 200 in which an initiator logical processor (ILP) initiates a remote action request (RAR). In at least one embodiment, a set of operations corresponds to the activities of FIG. 3. An initiator logical processor (e.g., 220) or a portion thereof, may utilize at least some of the operations. In one example, the operations may be performed by some combination of a core or processor (e.g., 210), remote action interface (e.g., 223), interrupt controller (e.g., 224), and TLB (e.g., 227) of the ILP.

In some embodiments, at 302, an indication that a page table entry can be used in address translation is updated in any suitable manner by the ILP. For example, a present bit in the page table entry is cleared to indicate that it cannot be used.

At 304, one or more processors are identified as remote logical processors (RLPs) to receive a RAR. In at least one embodiment, the one or more RLPs are identified to receive a RAR based on need. The ILP is aware of which RLPs were assigned to running in the enclave mode and which RLPs should receive a TLB entry invalidation request. In another approach, all RLPs running in the platform are identified to receive a RAR.

The ILP configures a payload in memory at 306. For example, an instruction to invalidate a TLB entry for a page and an address of that page are stored in a payload data structure 266 in system memory 260.

The ILP causes an IPI to be sent to the identified one or more RLPs at 308. In some embodiments, the ILP writes to an interrupt command register or software interrupt register that a RAR has been made, which triggers an interrupt to the RLP(s). This writing includes an identification (such as an APIC ID) of the RLP(s) to process the RAR. Any suitable delivery mode can be used for the IPI. For example, possible delivery modes may include, but are not limited to, fixed, lowest priority, remote action request (RAR), system management interrupt (SMI), non-markable interrupt (NMI), INIT, start-up, and reserved. For example, at least some of these interrupt delivery mechanisms are further described in the Intel® 64 and IA-32 Architectures Software Developer's Manual, Volume 3A, Chapter 10 (October 2017).

In some embodiments, a corresponding action is performed locally in the ILP at 310. For example, ILP 220 can invalidate a TLB entry for the targeted page in its own TLB 227.

At 312, the ILP polls an action data structure in memory (e.g., 264) to determine if all of the RLPs have completed and acknowledged the action. This may be repeated after a set amount of time and if the action data structure does not change for a threshold amount of time (cycles), then the ILP may trigger software to do further processing.

Figure 4:
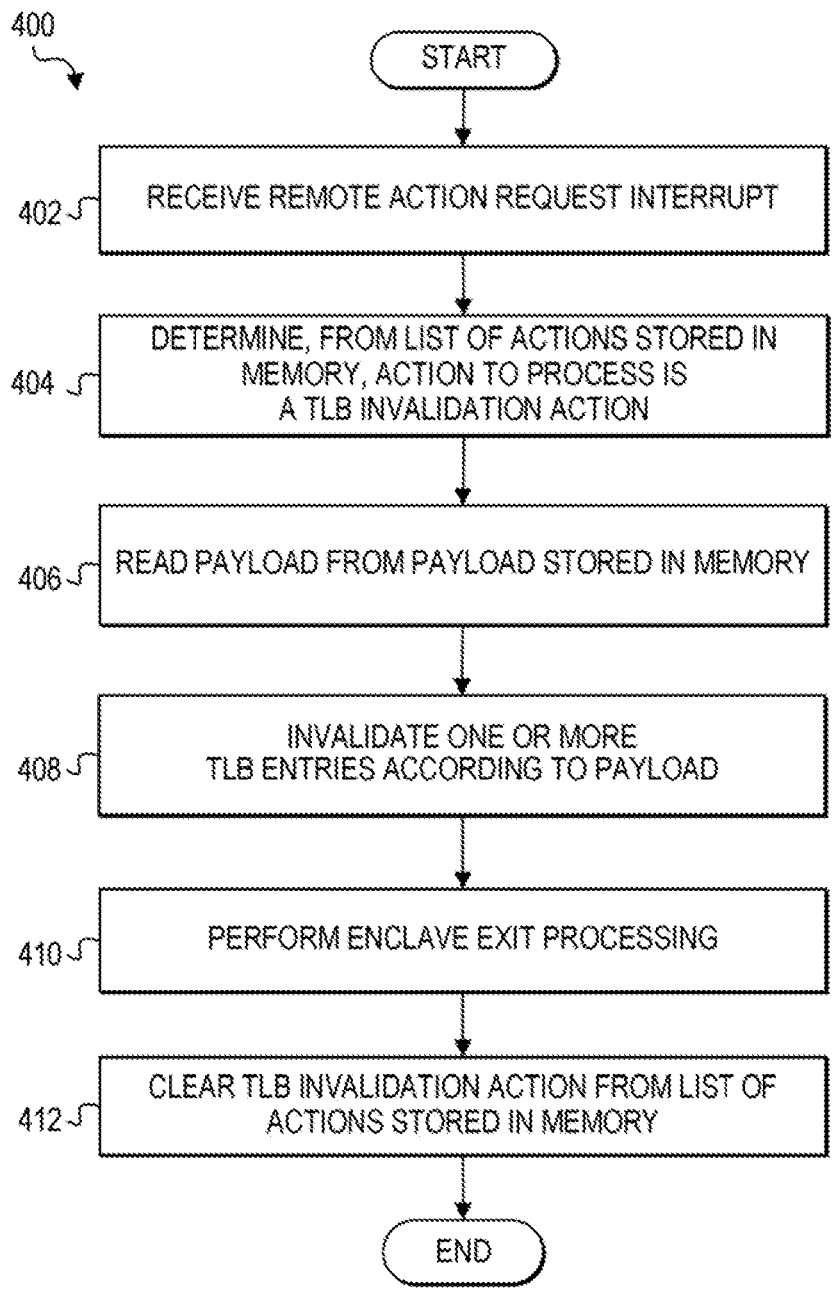
FIG. 4 is a simplified flowchart of potential operations associated with processing remote action requests in accordance with certain embodiments.

FIG. 4 is a simplified flowchart 400 that illustrates possible operations that may be associated with an embodiment of computing system 200 in which a remote logical processor (RLP) receives a remote action request (RAR) from an ILP and processes the RAR. In at least one embodiment, a set of operations corresponds to the activities of FIG. 4. An RLP (e.g., LP1 230) or a portion thereof, may utilize at least some of the operations. In one example, the operations may be performed by some combination of a core or processor (e.g., 210), remote action interface 233, remote action handler (e.g., 231), enclave exit handler (e.g., 232), and TLB (e.g., 237) of the RLP.

In 402, the RLP receives a RAR interrupt (e.g., using any suitable delivery mode for IPIs) from an ILP. The RLP may receive this interrupt via its remote action interface (e.g., 233) which has been detailed above.

In 404, the RLP (e.g., remote action handler 231) determines the action to be performed is an invalidate TLB entry action by reading from a list of actions stored in memory. For example, the RLP reads an action from actions data structure 264.

In 406, the RLP (e.g., remote action handler 231) reads a payload from memory associated with the action. For example, the RLP reads a payload from payload data structure 266. For example, an RLP may read for a valid payload, a TLB invalidation request along with a page address to invalidate in the TLB.

In 408, the RLP (e.g., remote action handler 231) invalidates (e.g., flushes, deletes, clears, etc.) one or more entries from the TLB according to the payload. For example, the payload may contain one or more addresses of enclave pages stored in EPC 240 to be invalidated. The one or more addresses in the payload can be used to identify corresponding TLB entries, which can then be invalidated. The payload may specify a single address of a page in the enclave address range, all addresses (or an indication of all addresses) of pages in the enclave address range, or a set of addresses in which at least one of the pages is in the enclave address range. In at least one embodiment, the specified address (or addresses) may be a linear address (or addresses) that is compared to an enclave linear address range. In addition, in some embodiments, the remote action handler includes circuitry with microcode to perform the action itself. In other embodiments, the remote action handler calls a particular handler to perform the action.

At 410, the RLP can perform enclave exit processing (e.g., remote action handler 231). In some embodiments, the remote action handler includes circuitry with microcode to perform the enclave exit processing. In other embodiments it may call another handler to perform enclave exit processing. Enclave exit processing includes enclave mode handling to determine whether to execute an asynchronous exit from the enclave or to continue running in the enclave mode. In some embodiments, enclave mode handling may be performed by the remote action handler. In other embodiments, another handler (e.g., enclave mode handler 233) may be called to perform the enclave mode handling. The decision to perform enclave mode handling is based, at least in part, on determining the RLP is running in an enclave mode, determining one or more requested pages to be invalidated are within the enclave address range, and determining the RLP entered the enclave mode during the prior epoch. These determinations and the subsequent enclave mode handling are further described in more detail in FIG. 7.

In 412, the RLP (e.g., remote action handler 231) clears the action from the actions data structure stored in memory. For example, the RLP clears a TLB invalidation action from actions data structure 264.

Figure 5:
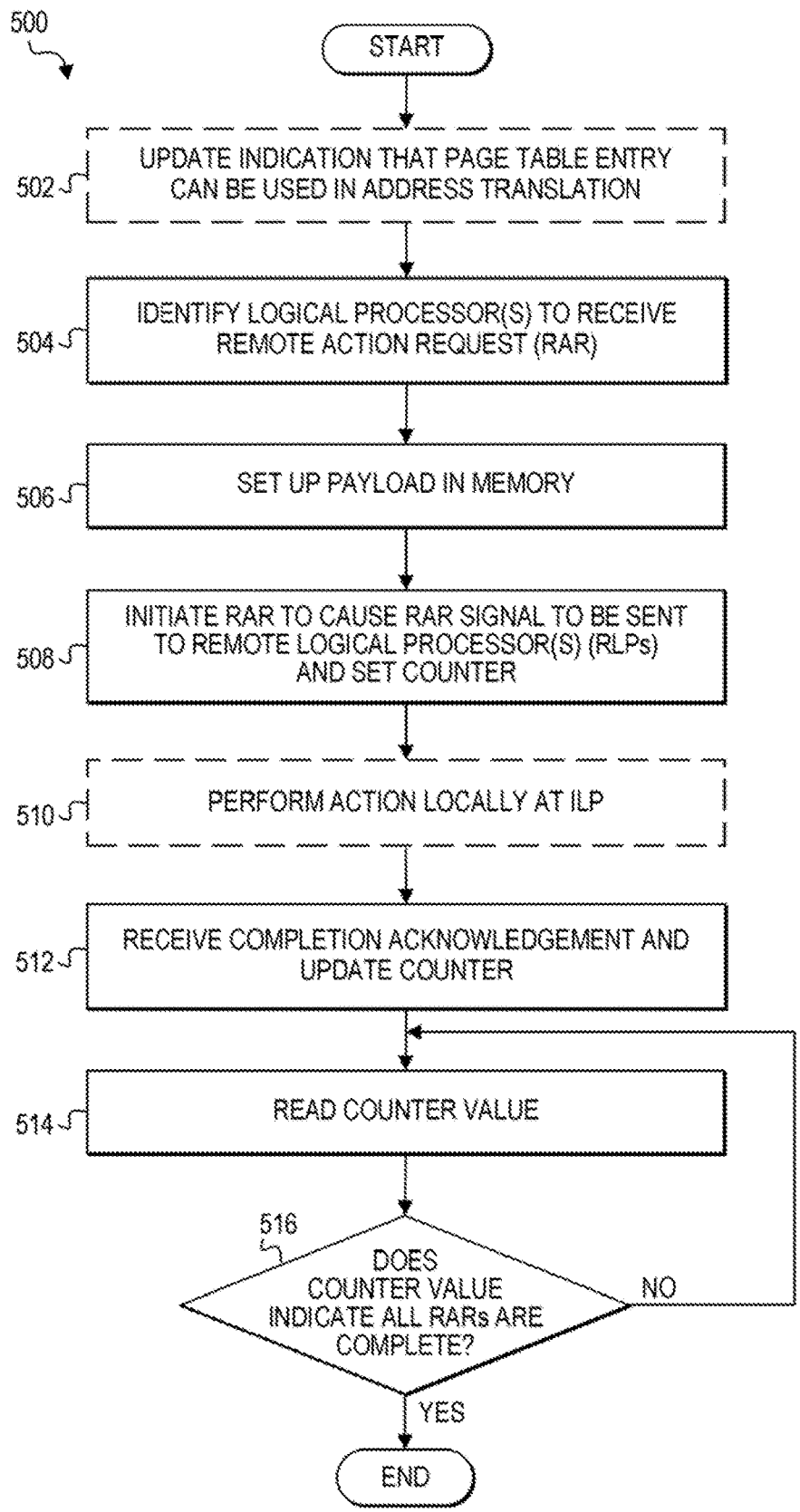
FIG. 5 is a simplified flowchart of potential operations associated with initiating remote action requests in accordance with certain other embodiments.

FIG. 5 is a simplified flowchart 500 that illustrates possible operations that may be associated with an embodiment of computing system 200 in which an initiator logical processor (ILP) initiates a remote action request (RAR). In at least one embodiment, a set of operations corresponds to the activities of FIG. 5. An initiator logical processor (e.g., 220) or a portion thereof, may utilize at least some of the operations. In one example, the operations may be performed by some combination of a core or processor (e.g., 210), remote action interface (e.g., 223), interrupt controller (e.g., 224), and TLB (e.g., 227) of the ILP.

In some embodiments, at 502, an indication that a page table entry can be used in address translation is updated in any suitable manner by the ILP. For example, a present bit in the page table entry is cleared to indicate that it cannot be used.

At 504, one or more logical processors are identified as RLPs to receive a RAR. In at least one embodiment, the one or more RLPs are identified to receive a RAR based on need. The ILP is aware of which RLPs were assigned to running in the enclave mode and which RLPs should receive a TLB entry invalidation request. In another approach, all RLPs running in the platform are identified to receive a RAR.

The ILP configures a payload in memory at 506. For example, an instruction to invalidate a TLB entry for a page and an address of that page are stored in a payload data structure 266 in system memory 260.

At 508, a RAR can be initiated on the ILP by a write to a register of an interrupt controller. A RAR signal is sent from the ILP to the identified RLPs and a counter value can be set to the number of identified RLPs. For example, a RAR signal is sent by remote action interface 223 via a bus or interconnect 211 to each of the identified RLPs, such as LP1 230. In addition, RAR counter 226 is set to a number of RLPs that are to handle the request.

In some embodiments, a corresponding action is performed locally in the ILP at 510. For example, the ILP 220 can invalidate a TLB entry for the targeted page in its own TLB 227.

At 512, a completion acknowledgment is received from an RLP and the counter is updated (decremented) to reflect completion. For example, an RLP 230 performs the requested action and sends an acknowledgment over the bus or interconnect 211 to the remote action interface 223 and/or RAR counter 226.

At 514, a value of the counter (e.g., 226) is read.

A determination of whether the read value indicates that all RLPs have completed the request is made at 516. For example, a determination may be made as to whether the counter is zero.

When the counter indicates that all RLPs have completed the RAR action and the request has been handled by all RLPs, then the method is complete. If not, then the counter is read again at 514 after another acknowledgment is received. If the counter does not change for a set threshold amount of time (cycles), then the ILP can trigger software to do further processing. Also, once the method is complete, the ILP can issue an instruction on the target enclave page (e.g., software instruction) to complete the eviction. Eviction can be completed by encrypting the target enclave page, writing the encrypted page back to another area of memory (e.g., other memory 261) or non-volatile storage, and removing the target enclave page from the EPC.

Figure 6:
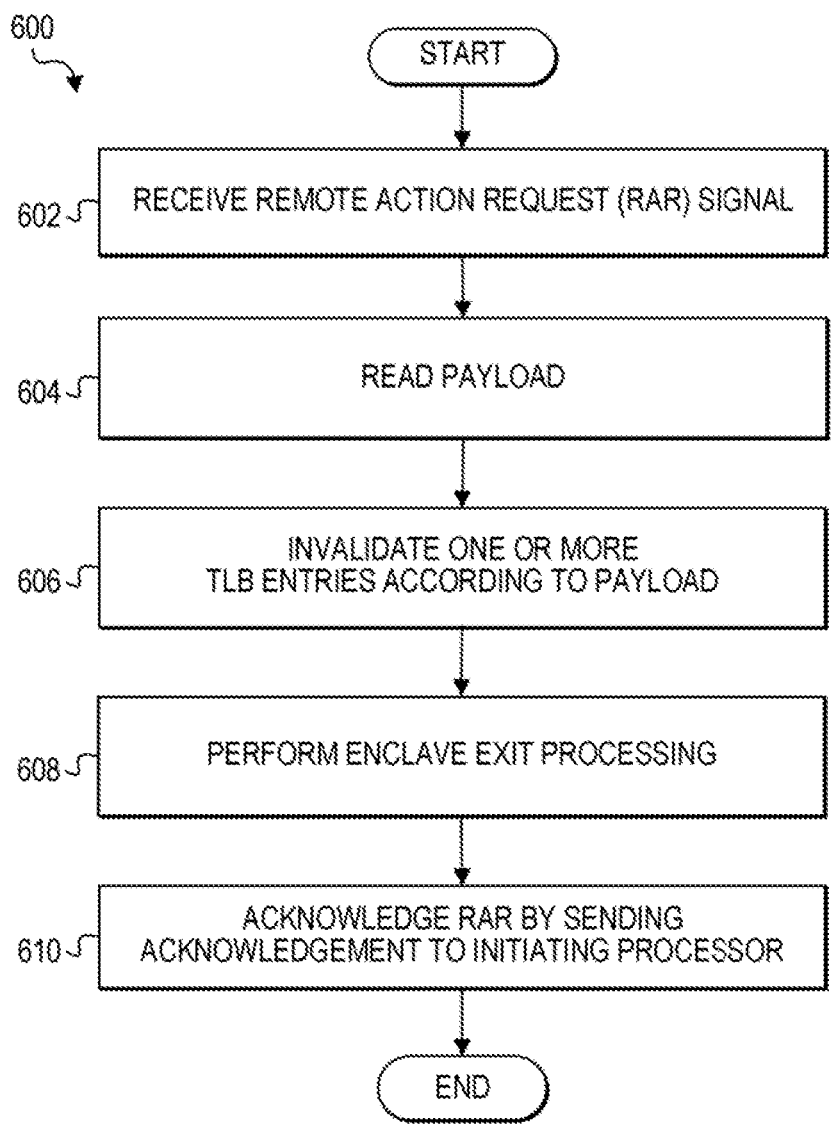
FIG. 6 is a simplified flowchart of potential operations associated with processing remote action requests in accordance with certain other embodiments.

FIG. 6 is a simplified flowchart 600 that illustrates possible operations that may be associated with an embodiment of computing system 200 in which a remote logical processor (RLP) receives a remote action request (RAR) from an ILP and processes the RAR. In at least one embodiment, a set of operations corresponds to the activities of FIG. 6. In at least one embodiment, the operations include microcode. A remote logical processor (e.g., LP1 230) or a portion thereof, may utilize at least some of the operations. In one example, the operations may be performed by some combination of a core or processor (e.g., 210), remote action interface (e.g., 233), remote action handler (e.g., 231), enclave exit handler (e.g., 232), and TLB (e.g., 237) of the RLP.

At 602, the RLP receives a RAR signal from an ILP. The RLP receives this signal via its remote action interface which has been detailed above. In some embodiments, the ILP executes an instruction to cause a signal to be sent to the RLP(s) regarding the RAR. The ILP may also store a payload associated with the RAR signal into a payload data structure.

At 604, the RLP (e.g., the remote action interface 233) reads a payload from memory. For example, the RLP reads a payload from payload data structure 266. For example, in a valid payload, an RLP may read a TLB invalidation request and its associated address.

At 606, the RLP (e.g., the remote action handler 231) invalidates (e.g., flushes, deletes, clears, etc.) one or more entries from the TLB according to the payload. For example, the payload may contain one or more addresses of pages stored in EPC 240 to be invalidated. The one or more addresses in the payload can be used to identify corresponding TLB entries, which can then be invalidated. The payload may specify a single address of a page in the enclave address range, all addresses (or an indication of all addresses) of pages in the enclave address range, or a set of addresses in which at least one of the pages is in the enclave address range. In at least one embodiment, the specified address (or addresses) may be a linear address (or addresses) that is compared to an enclave linear address range. In addition, in some embodiments, the remote action handler includes circuitry with microcode to perform the action itself. In other embodiments, the remote action handler calls a particular handler to perform the action.

At 608, the RLP can perform enclave exit processing (e.g., remote action handler 231). In some embodiments, the remote action handler includes circuitry with microcode to perform the enclave exit processing. In other embodiments it may call another handler to perform enclave exit processing. Enclave exit processing includes enclave mode handling to determine whether to execute an asynchronous exit from the enclave or to continue running in the enclave mode. In some embodiments, enclave mode handling may be performed by the remote action handler. In other embodiments, another handler (e.g., enclave mode handler 232) may be called to perform the enclave mode handling. The decision to perform enclave mode handling is based, at least in part, on determining the RLP is running in an enclave mode, determining one or more requested page addresses in TLB entries to be invalidated are within the enclave address range, and determining the RLP entered the enclave mode during the prior epoch. These determinations and the subsequent enclave mode handling are further described in more detail in FIG. 7.

In 610, the RLP (e.g., remote action handler 231) acknowledges the RAR by sending an acknowledgment to the ILP. For example, the RLP sends an acknowledgment to the ILP, which then decrements its counter.

Figure 7:
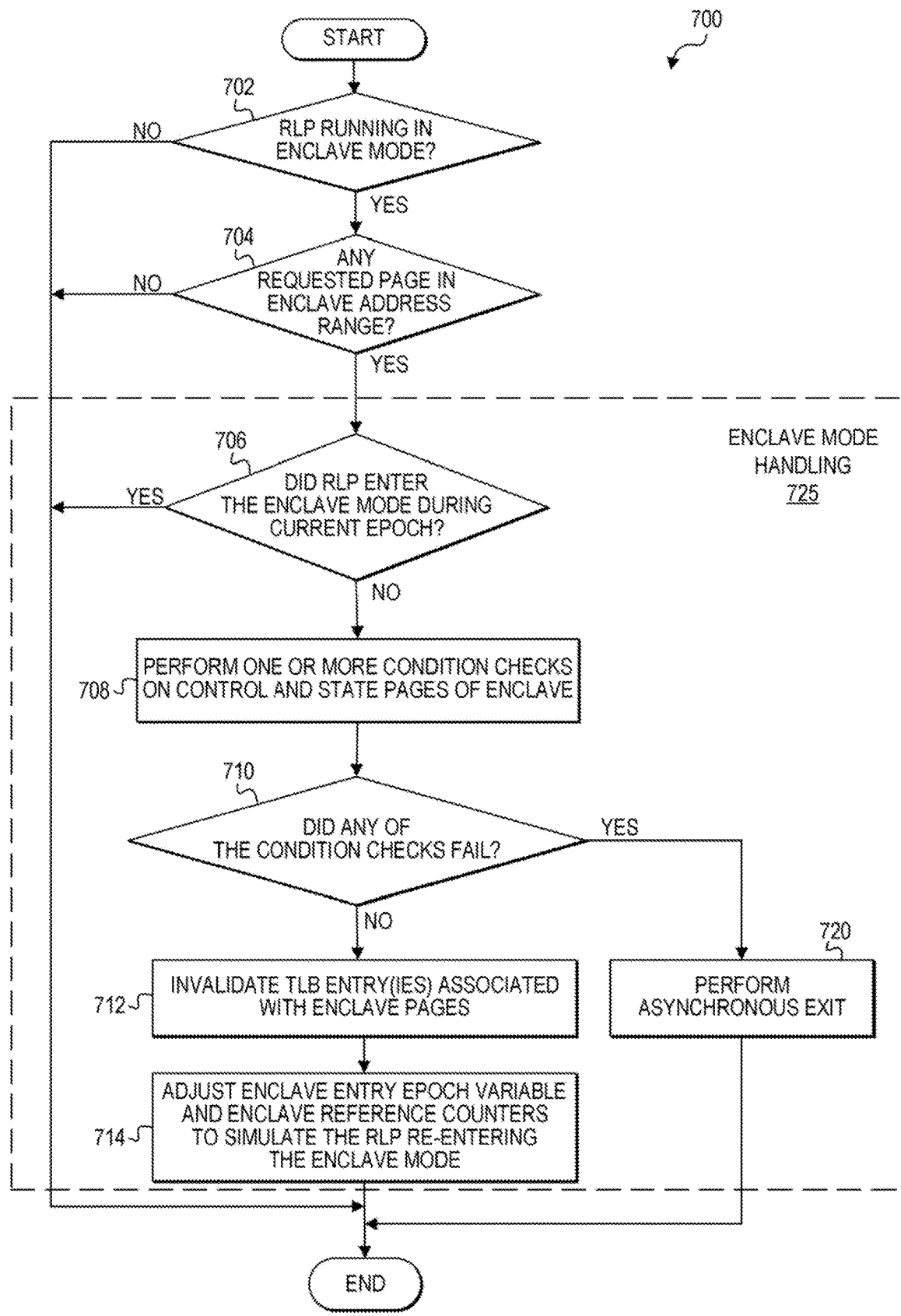
FIG. 7 is a simplified flowchart of potential operations associated with enclave exit processing in accordance with certain embodiments.

FIG. 7 is a simplified flowchart 700 that illustrates possible operations that may be associated with an embodiment of computing system 200 in which an RLP performs enclave exit processing after receiving a remote action request (RAR) interrupt or signal from an ILP. In at least one embodiment, a set of operations corresponds to the activities of FIG. 7. In at least one embodiment, the operations may be performed, at least in part, by circuitry that includes microcode. A remote logical processor (e.g., LP1 230) or a portion thereof, may utilize at least some of the operations. In one example, the operations may be performed by some combination of a core or processor (e.g., 210), a remote action handler (e.g., 231) an enclave exit handler (e.g., 232), and a TLB (e.g., 237) of the RLP. In at least one embodiment, operations indicated by flowchart 700 correspond to performing enclave exit processing indicated at 410 of FIG. 4 and at 608 of FIG. 6.

At 702, a determination of whether the RLP is running in an enclave mode is made. For example, in at least one embodiment, a flag associated with the RLP indicates whether the RLP is currently running in an enclave mode and can be checked to make the determination at 702. If it is determined that the RLP is not running in an enclave mode, then enclave mode handling 725 is not performed and the RLP may continue running outside the enclave mode.

At 702, if it is determined that the RLP is running in an enclave mode, then at 704, a determination is made as to whether any requested page in the RAR (e.g., specified in a RAR payload) is within an enclave address range. The enclave address range may be provided in an enclave control structure (e.g., SECS) for the enclave in one example. One or more of the page addresses indicated by the RAR may be compared to the enclave address range. If it is determined that none of the page addresses indicated by the RAR is within the enclave address range, then enclave mode handling 725 is not performed and the RLP may continue running in the enclave mode.

At 704, if it is determined that one (or more) of the page addresses indicated by the RAR is within the enclave address range, then enclave mode handling 725 may be performed. At 706, a determination is made as to whether the RLP entered the enclave mode during the current epoch, which is defined as a period associated with a current value of a global epoch variable. This evaluation is described in further detail in FIG. 8. If it is determined that the RLP entered the enclave during the current epoch, then enclave mode handling 725 ends and the RLP may continue running in the enclave mode.

At 706, if it is determined that the RLP did not enter the enclave mode during the current epoch (e.g., the RLP entered the enclave during a period associated with a prior value of the global epoch variable), then further processing occurs in enclave mode handling 725. A prior value is a value that was previously assigned to the global epoch variable. A prior value of the global epoch variable may also be a lower value than a current value of the global epoch variable.

At 708, one or more condition checks may be performed on control and state pages (e.g., TCS page, SSA page(s)) of the enclave. If any of the control or state pages have been modified, blocked, or otherwise made inaccessible, then at least one of the condition checks will fail. If any of the condition checks fail, as determined at 710, then the RLP cannot continue to run in the enclave mode and an asynchronous exit is performed at 720.

If none of the condition checks fail, as determined at 710, then an asynchronous exit is avoided. In this scenario, however, additional operations are performed to adjust the TLB state and ensure accurate TLB tracking. At 712, the TLB entries of enclave context are invalidated (e.g., flushed, deleted, cleared, etc.). A TLB entry has enclave context if it contains a page address that is within an enclave address range of memory (e.g., within the portion of EPC 240 allocated to that enclave). In the example implementation shown herein, TLB entries indicated by the RAR are invalidated at 408 in FIG. 4 or 606 in FIG. 6. In some scenarios, however, the RAR may not provide addresses for all pages stored in the enclave address range. Accordingly, any TLB entries corresponding to enclave pages that are not indicated by the RAR can be invalidated at 712. In some implementations, all TLB entries of enclave context (whether specified in the RAR or not) are invalidated at 712, even if one or more of those TLB entries were previously invalidated based on the RAR, for example at 408 in FIG. 4 or 606 in FIG. 6. It should be noted, however, that invalidating only the TLB entries for enclave pages that were not previously invalidated is also possible at 712.

At 714, the enclave entry epoch variable associated with the RLP and one or more enclave reference counters associated with the RLP are adjusted to simulate the RLP re-entering the enclave mode as if an asynchronous exit operation had been performed by the RLP and an instruction to re-enter the enclave mode (e.g., ERESUME instruction) was subsequently executed. More specifically, the enclave entry epoch variable associated with the RLP is adjusted to equal the current value of the global epoch variable. In addition, the enclave reference counters are adjusted as if the RLP just re-entered the enclave mode. For example, the enclave reference counter for the current epoch is incremented by 1, and the enclave reference counter for the prior epoch is decremented by 1. This enables the RLP to continue running in the enclave mode when an enclave page is evicted, thus avoiding the excessive clock cycles that would otherwise be consumed by performing an asynchronous exit from the enclave mode and a subsequent re-entry into the enclave mode.

Figure 8:
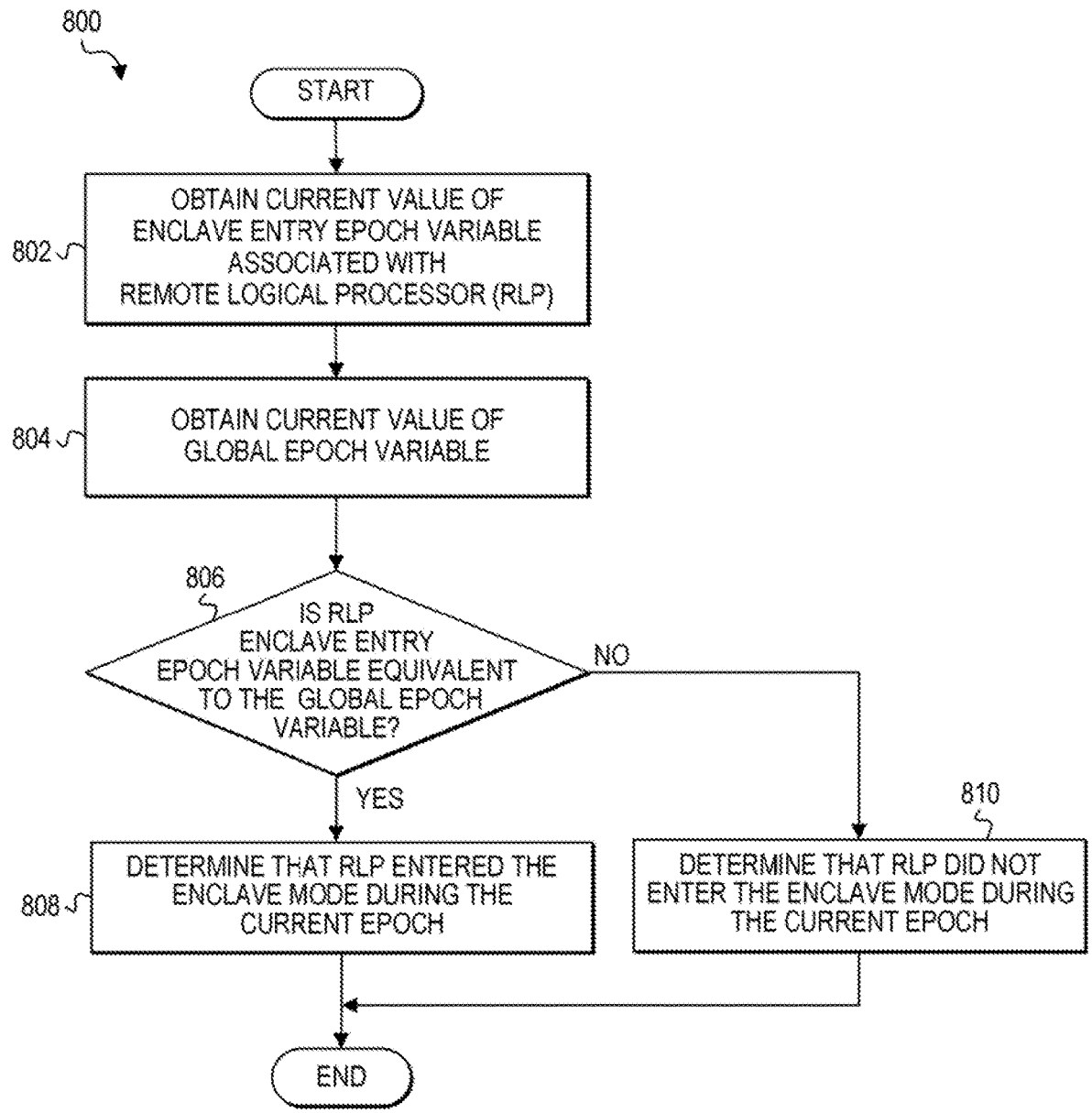
FIG. 8 is a simplified flowchart of further potential operations associated with enclave exit processing in accordance with certain embodiments.

FIG. 8 is a simplified flowchart 800 that illustrates further possible operations that may be associated with an embodiment of computing system 200 in which a remote logical processor (RLP) has received a remote action request (RAR) from an ILP. In at least one embodiment, a set of operations corresponds to the activities of FIG. 8. In at least one embodiment, the operations include microcode. An RLP (e.g., LP1 230) or a portion thereof, may utilize at least some of the operations. In one example, the operations may be performed by some combination of a core or processor (e.g., 210), a remote action handler (e.g., 231), and an enclave exit handler (e.g., 232) of the RLP. In at least one embodiment, operations indicated by flowchart 800 correspond to operation 706 of FIG. 7.

At 802, a current value of an enclave entry epoch variable associated with the RLP is obtained. At 804, a current value of a global epoch variable is obtained. In at least one embodiment, these variables may be read from an enclave control structure. For example, in FIG. 1, SECS is the main control structure of the enclave and may be stored in a dedicated page (e.g., 243) of EPC 240. SECS.CBEPOCH is the global epoch variable, and CR_EV is the enclave entry epoch variable for LP1.

The obtained values of the global epoch variable and the enclave entry epoch variable can be compared at 806. If they are equivalent, then a determination is made at 808 that the RLP entered the enclave mode during the current epoch. If they are not equivalent, then a determination is made at 810 that the RLP did not enter the enclave mode during the current epoch. Accordingly, this determination can be used at the decision block 706 of FIG. 7.

The FIGURES described below detail exemplary architectures and systems to implement embodiments of the above. In some embodiments, one or more hardware components and/or instructions described above are emulated as detailed below, or implemented as software modules. Other computer architecture designs known in the art for processors, mobile devices, computing systems, and components thereof may also (or alternatively) be used. Generally, suitable computer architectures for embodiments disclosed herein can include, but are not limited to, configurations illustrated in FIGS. 9-17.

Embodiments of the instruction(s) detailed above may be embodied in a "generic vector friendly instruction format" which is detailed below. In other embodiments, such a format is not utilized and another instruction format may be used, however, the description below of the writemask registers, various data transformations (swizzle, broadcast, etc.), addressing, etc. is generally applicable to the description of the embodiments of the instruction(s) above. Additionally, exemplary systems, architectures, and pipelines are detailed below. Embodiments of the instruction(s) above, if any, may be executed on such systems, architectures, and pipelines, but are not limited to those detailed.

An instruction set may include one or more instruction formats. A given instruction format may define various fields (e.g., number of bits, location of bits) to specify, among other things, the operation to be performed (e.g., opcode) and the operand(s) on which that operation is to be performed and/or other data field(s) (e.g., mask). Some instruction formats are further broken down though the definition of instruction templates (or subformats). For example, the instruction templates of a given instruction format may be defined to have different subsets of the instruction format's fields (the included fields are typically in the same order, but at least some have different bit positions because there are less fields included) and/or defined to have a given field interpreted differently. Thus, each instruction of an ISA is expressed using a given instruction format (and, if defined, in a given one of the instruction templates of that instruction format) and includes fields for specifying the operation and the operands. For example, an exemplary ADD instruction has a specific opcode and an instruction format that includes an opcode field to specify that opcode and operand fields to select operands (source1/destination and source2); and an occurrence of this ADD instruction in an instruction stream will have specific contents in the operand fields that select specific operands. A set of SIMD extensions referred to as the Advanced Vector Extensions (AVX) (AVX1 and AVX2) and using the Vector Extensions (VEX) coding scheme has been released and/or published (e.g., see Intel® 64 and IA-32 Architectures Software Developer's Manual, September 2014; and see Intel® Advanced Vector Extensions Programming Reference, October 2014).

Embodiments of the instruction(s) referenced herein may be embodied in different formats. Additionally, exemplary systems, architectures, and pipelines are detailed below. Embodiments of the instruction(s) may be executed on such systems, architectures, and pipelines, but are not limited to those detailed.

Figure 9:
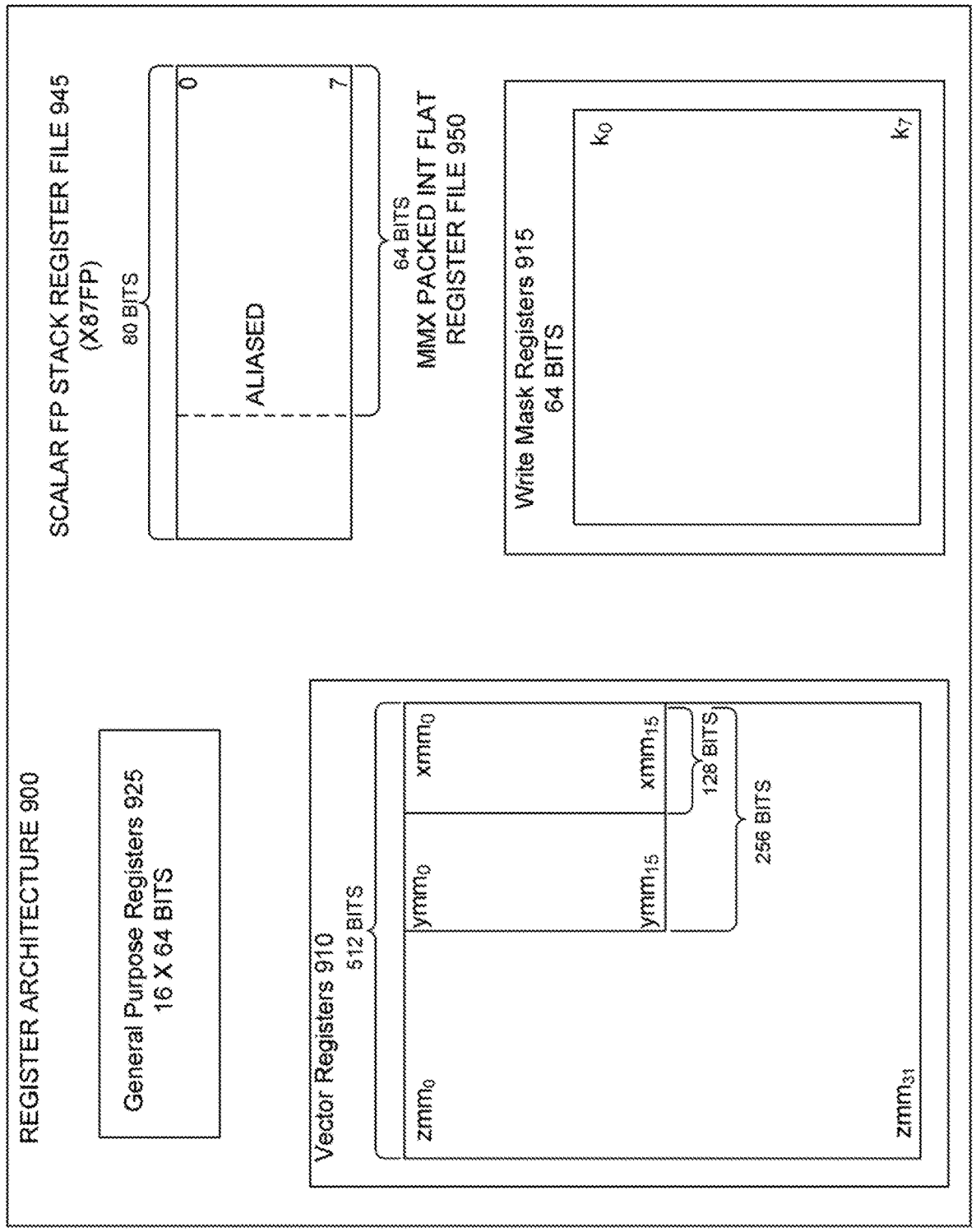
FIG. 9 is a block diagram of a register architecture in accordance with certain embodiments.

FIG. 9 is a block diagram of a register architecture 900 according to one embodiment of the present disclosure. In the embodiment illustrated, there are 32 vector registers 910 that are 512 bits wide; these registers are referenced as zmm0 through zmm31. The lower order 256 bits of the lower 16 zmm registers are overlaid on registers ymm0-15. The lower order 128 bits of the lower 16 zmm registers (the lower order 128 bits of the ymm registers) are overlaid on registers xmm0-15.

In other words, a vector length field selects between a maximum length and one or more other shorter lengths, where each such shorter length is half the length of the preceding length; and instructions templates without the vector length field operate on the maximum vector length. Further, in one embodiment, the class B instruction templates of a specific vector friendly instruction format operate on packed or scalar single/double-precision floating point data and packed or scalar integer data. Scalar operations are operations performed on the lowest order data element position in an zmm/ymm/xmm register; the higher order data element positions are either left the same as they were prior to the instruction or zeroed depending on the embodiment.

Write mask registers 915—in the embodiment illustrated, there are 8 write mask registers (k0 through k7), each 64 bits in size. In an alternate embodiment, the write mask registers 915 are 16 bits in size. As previously described, in one embodiment, the vector mask register k0 cannot be used as a write mask; when the encoding that would normally indicate k0 is used for a write mask, it selects a hardwired write mask of 0xFFFF, effectively disabling write masking for that instruction.

General-purpose registers 925—in an embodiment, there may be sixteen 64-bit general-purpose registers that are used along with the existing x86 addressing modes to address memory operands. These registers are referenced by the names RAX, RBX, RCX, RDX, RBP, RSI, RDI, RSP, and R8 through R15.

Scalar floating point stack register file (x87 stack) 945, on which is aliased the MMX packed integer flat register file 950—in an embodiment, the x87 stack is an eight-element stack used to perform scalar floating-point operations on 32/64/80-bit floating point data using the x87 instruction set extension; while the MMX registers are used to perform operations on 64-bit packed integer data, as well as to hold operands for some operations performed between the MMX and XMM registers.

Alternative embodiments of the present disclosure may use wider or narrower registers. Additionally, alternative embodiments of the present disclosure may use more, less, or different register files and registers.

Processor cores may be implemented in different ways, for different purposes, and in different processors. For instance, implementations of such cores may include: 1) a general purpose in-order core intended for general-purpose computing; 2) a high performance general purpose out-of-order core intended for general-purpose computing; 3) a special purpose core intended primarily for graphics and/or scientific (throughput) computing. Implementations of different processors may include: 1) a CPU including one or more general purpose in-order cores intended for general-purpose computing and/or one or more general purpose out-of-order cores intended for general-purpose computing; and 2) a coprocessor including one or more special purpose cores intended primarily for graphics and/or scientific (throughput). Such different processors lead to different computer system architectures, which may include: 1) the coprocessor on a separate chip from the CPU; 2) the coprocessor on a separate die in the same package as a CPU; 3) the coprocessor on the same die as a CPU (in which case, such a coprocessor is sometimes referred to as special purpose logic, such as integrated graphics and/or scientific (throughput) logic, or as special purpose cores); and 4) a system on a chip that may include on the same die the described CPU (sometimes referred to as the application core(s) or application processor(s)), the above described coprocessor, and additional functionality. Exemplary core architectures are described next, followed by descriptions of exemplary processors and computer architectures.

FIG. 10A is a block diagram illustrating both an exemplary in-order pipeline and an exemplary register renaming, out-of-order issue/execution pipeline according to one or more embodiments of this disclosure. FIG. 10B is a block diagram illustrating both an exemplary embodiment of an in-order architecture core and an exemplary register renaming, out-of-order issue/execution architecture core to be included in a processor according to one or more embodiments of this disclosure. The solid lined boxes in FIGS. 10A-10B illustrate the in-order pipeline and in-order core, while the optional addition of the dashed lined boxes illustrates the register renaming, out-of-order issue/execution pipeline and core. Given that the in-order aspect is a subset of the out-of-order aspect, the out-of-order aspect will be described.

In FIG. 10A, a processor pipeline 1000 includes a fetch stage 1002, a length decode stage 1004, a decode stage 1006, an allocation stage 1008, a renaming stage 1010, a schedule (also known as a dispatch or issue) stage 1012, a register read/memory read stage 1014, an execute stage 1016, a write back/memory write stage 1018, an exception handling stage 1022, and a commit stage 1024.

FIG. 10B shows processor core 1090 including a front end unit 1030 coupled to an execution engine unit 1050, and both are coupled to a memory unit 1070. The core 1090 may be a reduced instruction set computing (RISC) core, a complex instruction set computing (CISC) core, a very long instruction word (VLIW) core, or a hybrid or alternative core type. As yet another option, the core 1090 may be a special-purpose core, such as, for example, a network or communication core, compression engine, coprocessor core, general purpose computing graphics processing unit (GPGPU) core, graphics core, or the like. In addition, processor core 1090 and its components represent example architecture that could be used to implement logical processors (e.g., 220 and 230) and their respective components.

The front end unit 1030 includes a branch prediction unit 1032 coupled to an instruction cache unit 1034, which is coupled to an instruction translation lookaside buffer (TLB) unit 1036, which is coupled to an instruction fetch unit 1038, which is coupled to a decode unit 1040. The decode unit 1040 (or decoder) may decode instructions, and generate as an output one or more micro-operations, micro-code entry points, microinstructions, other instructions, or other control signals, which are decoded from, or which otherwise reflect, or are derived from, the original instructions. The decode unit 1040 may be implemented using various different mechanisms. Examples of suitable mechanisms include, but are not limited to, look-up tables, hardware implementations, programmable logic arrays (PLAs), microcode read only memories (ROMs), etc. In one embodiment, the core 1090 includes a microcode ROM or other medium that stores microcode for certain macroinstructions (e.g., in decode unit 1040 or otherwise within the front end unit 1030). The decode unit 1040 is coupled to a rename/allocator unit 1052 in the execution engine unit 1050.

The execution engine unit 1050 includes the rename/allocator unit 1052 coupled to a retirement unit 1054 and a set of one or more scheduler unit(s) 1056. The scheduler unit(s) 1056 represents any number of different schedulers, including reservations stations, central instruction window, etc. The scheduler unit(s) 1056 is coupled to the physical register file(s) unit(s) 1058. Each of the physical register file(s) units 1058 represents one or more physical register files, different ones of which store one or more different data types, such as scalar integer, scalar floating point, packed integer, packed floating point, vector integer, vector floating point, status (e.g., an instruction pointer that is the address of the next instruction to be executed), etc. In one embodiment, the physical register file(s) unit 1058 comprises a vector registers unit, a write mask registers unit, and a scalar registers unit. These register units may provide architectural vector registers, vector mask registers, and general purpose registers. The physical register file(s) unit(s) 1058 is overlapped by the retirement unit 1054 to illustrate various ways in which register renaming and out-of-order execution may be implemented (e.g., using a reorder buffer(s) and a retirement register file(s); using a future file(s), a history buffer(s), and a retirement register file(s); using register maps and a pool of registers; etc.). The retirement unit 1054 and the physical register file(s) unit(s) 1058 are coupled to the execution cluster(s) 1060. The execution cluster(s) 1060 includes a set of one or more execution units 1062 and a set of one or more memory access units 1064. The execution units 1062 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions.

The scheduler unit(s) 1056, physical register file(s) unit(s) 1058, and execution cluster(s) 1060 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster—and in the case of a separate memory access pipeline, certain embodiments are implemented in which only the execution cluster of this pipeline has the memory access unit(s) 1064). It should also be understood that where separate pipelines are used, one or more of these pipelines may be out-of-order issue/execution and the rest in-order.

The set of memory access units 1064 is coupled to the memory unit 1070, which includes a data TLB unit 1072 coupled to a data cache unit 1074 coupled to a level 2 (L2) cache unit 1076. In one exemplary embodiment, the memory access units 1064 may include a load unit, a store address unit, and a store data unit, each of which is coupled to the data TLB unit 1072 in the memory unit 1070. The instruction cache unit 1034 is further coupled to a level 2 (L2) cache unit 1076 in the memory unit 1070. The L2 cache unit 1076 is coupled to one or more other levels of cache and eventually to a main memory. TLB unit 1072 represents an example of TLBs 227 and 237, and data cache unit 1074 represents an example cache that includes EPC 240.

By way of example, the exemplary register renaming, out-of-order issue/execution core architecture may implement the pipeline 1000 as follows: 1) the instruction fetch 1038 performs the fetch and length decoding stages 1002 and 1004; 2) the decode unit 1040 performs the decode stage 1006; 3) the rename/allocator unit 1052 performs the allocation stage 1008 and renaming stage 1010; 4) the scheduler unit(s) 1056 performs the schedule stage 1012; 5) the physical register file(s) unit(s) 1058 and the memory unit 1070 perform the register read/memory read stage 1014; the execution cluster 1060 perform the execute stage 1016; 6) the memory unit 1070 and the physical register file(s) unit(s) 1058 perform the write back/memory write stage 1018; 7) various units may be involved in the exception handling stage 1022; and 8) the retirement unit 1054 and the physical register file(s) unit(s) 1058 perform the commit stage 1024.

The core 1090 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.), including the instruction(s) described herein. In one embodiment, the core 1090 includes logic to support a packed data instruction set extension (e.g., AVX1, AVX2), thereby allowing the operations used by many multimedia applications to be performed using packed data.

It should be understood that the core may support multi-threading (executing two or more parallel sets of operations or threads), and may do so in a variety of ways including time sliced multithreading, simultaneous multithreading (where a single physical core provides a logical core for each of the threads that physical core is simultaneously multi-threading), or a combination thereof (e.g., time sliced fetching and decoding and simultaneous multithreading thereafter such as in the Intel® Hyperthreading technology). Accordingly, in at least some embodiments, multi-threaded enclaves may be supported.

While register renaming is described in the context of out-of-order execution, it should be understood that register renaming may be used in an in-order architecture. While the illustrated embodiment of the processor also includes separate instruction and data cache units 1034/1074 and a shared L2 cache unit 1076, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 11B:
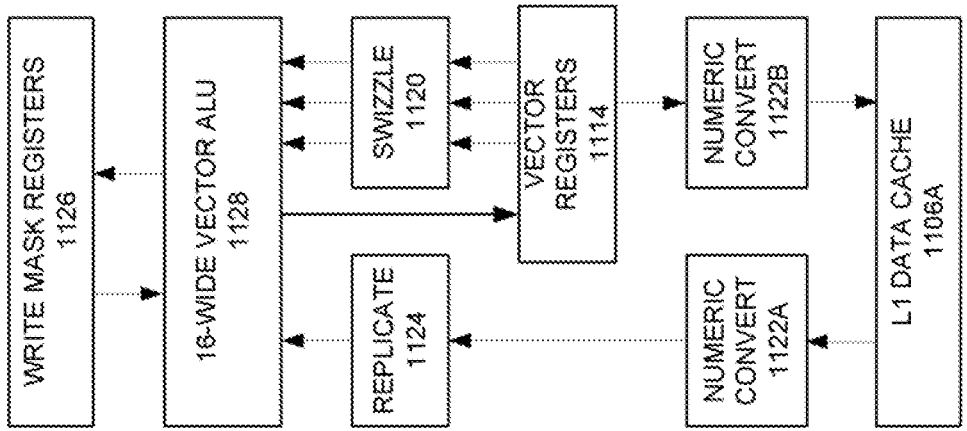
FIGS. 11A-11B illustrate a block diagram of a more specific exemplary in-order core architecture, which core would be one of several logic blocks (including other cores of the same type and/or different types) in a chip in accordance with certain embodiments.
Figure 11A:
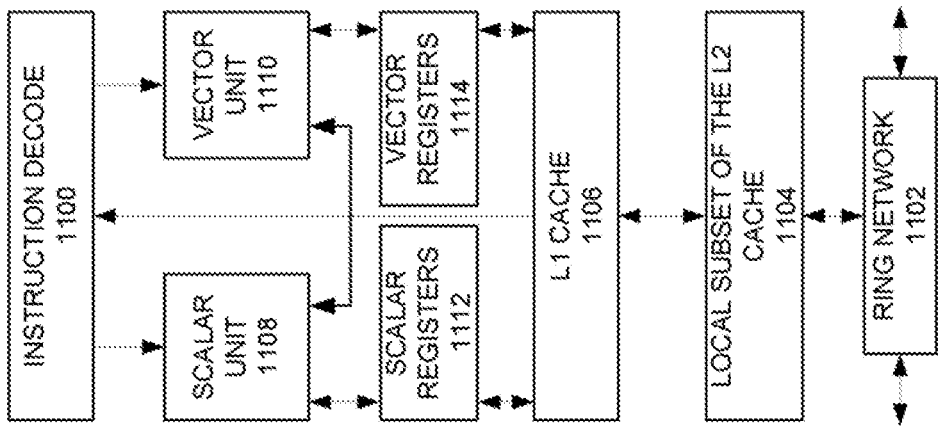

FIGS. 11A-11B illustrate a block diagram of a more specific exemplary in-order core architecture, which core would be one of several logic blocks (including other cores of the same type and/or different types) in a chip. The logic blocks communicate through a high-bandwidth interconnect network (e.g., a ring network) with some fixed function logic, memory I/O interfaces, and other necessary I/O logic, depending on the application.

FIG. 11A is a block diagram of a single processor core, along with its connection to the on-die interconnect network 1102 and with its local subset of the Level 2 (L2) cache 1104, according to one or more embodiments of this disclosure. In one embodiment, an instruction decoder 1100 supports the x86 instruction set with a packed data instruction set extension. An L1 cache 1106 allows low-latency accesses to cache memory into the scalar and vector units. While in one embodiment (to simplify the design), a scalar unit 1108 and a vector unit 1110 use separate register sets (respectively, scalar registers 1112 and vector registers 1114) and data transferred between them is written to memory and then read back in from a level 1 (L1) cache 1106, alternative embodiments of the present disclosure may use a different approach (e.g., use a single register set or include a communication path that allows data to be transferred between the two register files without being written and read back).

The local subset of the L2 cache 1104 is part of a global L2 cache that is divided into separate local subsets, one per processor core. Each processor core has a direct access path to its own local subset of the L2 cache 1104. Data read by a processor core is stored in its L2 cache subset 1104 and can be accessed quickly, in parallel with other processor cores accessing their own local L2 cache subsets. Data written by a processor core is stored in its own L2 cache subset 1104 and is flushed from other subsets, if necessary. The ring network ensures coherency for shared data. The ring network 1102 is bi-directional to allow agents such as processor cores, L2 caches and other logic blocks to communicate with each other within the chip. Each ring data-path is 1012-bits wide per direction.

FIG. 11B is an expanded view of part of the processor core in FIG. 11A according to one or more embodiments of this disclosure. FIG. 11B includes an L1 data cache 1106A, part of the L2 cache 1104, as well as more detail regarding the vector unit 1110 and the vector registers 1114. Specifically, the vector unit 1110 is a 16-wide vector processing unit (VPU) (see the 16-wide ALU 1128), which executes one or more of integer, single-precision float, and double-precision float instructions. The VPU supports swizzling the register inputs with swizzle unit 1120, numeric conversion with numeric convert units 1122A-B, and replication with replication unit 1124 on the memory input. Write mask registers 1126 allow predicating resulting vector writes.

Figure 12:
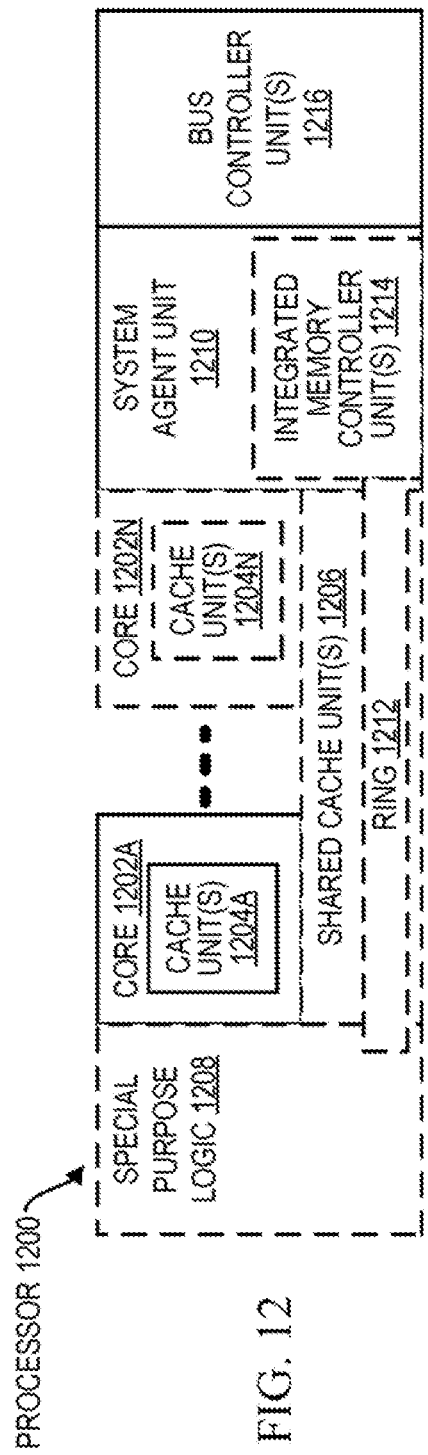
FIG. 12 is a block diagram of a processor that may have more than one core, may have an integrated memory controller, and may have integrated graphics in accordance with certain embodiments.

FIG. 12 is a block diagram of a processor 1200 that may have more than one core, may have an integrated memory controller, and may have integrated graphics according to one or more embodiments of this disclosure. The solid lined boxes in FIG. 12 illustrate a processor 1200 with a single core 1202A, a system agent unit 1210, a set of one or more bus controller units 1216, while the optional addition of the dashed lined boxes illustrates an alternative processor 1200 with multiple cores 1202A-N, a set of one or more integrated memory controller unit(s) 1214 in the system agent unit 1210, and special purpose logic 1208. Processor 1200 and its components (e.g., cores 1202A-N, cache unit(s) 1204A-N, shared cache unit(s) 1206, etc.) represent example architecture that could be used to implement processor 210 and at least some of its components.

Thus, different implementations of processor 1200 may include: 1) a CPU with the special purpose logic 1208 being integrated graphics and/or scientific (throughput) logic (which may include one or more cores), and the cores 1202A-N being one or more general purpose cores (e.g., general purpose in-order cores, general purpose out-of-order cores, a combination of the two); 2) a coprocessor with the cores 1202A-N being a large number of special purpose cores intended primarily for graphics and/or scientific (throughput); and 3) a coprocessor with the cores 1202A-N being a large number of general purpose in-order cores. Thus, the processor 1200 may be a general-purpose processor, coprocessor or special-purpose processor, such as, for example, a network or communication processor, compression engine, graphics processor, GPGPU (general purpose graphics processing unit), a high-throughput many integrated core (MIC) coprocessor (including 30 or more cores), embedded processor, or the like. The processor may be implemented on one or more chips. The processor 1200 may be a part of and/or may be implemented on one or more substrates using any of a number of process technologies, such as, for example, BiCMOS, CMOS, or NMOS.

The memory hierarchy includes one or more levels of cache within the cores, a set or one or more shared cache units 1206, and external memory (not shown) coupled to the set of integrated memory controller units 1214. The set of shared cache units 1206 may include one or more mid-level caches, such as level 2 (L2), level 3 (L3), level 4 (L4), or other levels of cache, a last level cache (LLC), and/or combinations thereof. While in one embodiment a ring based interconnect unit 1212 interconnects the special purpose logic 1208 (e.g., integrated graphics logic), the set of shared cache units 1206, and the system agent unit 1210/integrated memory controller unit(s) 1214, alternative embodiments may use any number of well-known techniques for interconnecting such units. In one embodiment, coherency is maintained between one or more cache units 1206 and cores 1202A-N.

In some embodiments, one or more of the cores 1202A-N are capable of multithreading. The system agent 1210 includes those components coordinating and operating cores 1202A-N. The system agent unit 1210 may include for example a power control unit (PCU) and a display unit. The PCU may be or include logic and components needed for regulating the power state of the cores 1202A-N and the integrated graphics logic 1208. The display unit is for driving one or more externally connected displays.

The cores 1202A-N may be homogenous or heterogeneous in terms of architecture instruction set; that is, two or more of the cores 1202A-N may be capable of executing the same instruction set, while others may be capable of executing only a subset of that instruction set or a different instruction set.

FIGS. 13-16 are block diagrams of exemplary computer architectures. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable for implementing embodiments described herein such as computing system 200.

Figure 13:
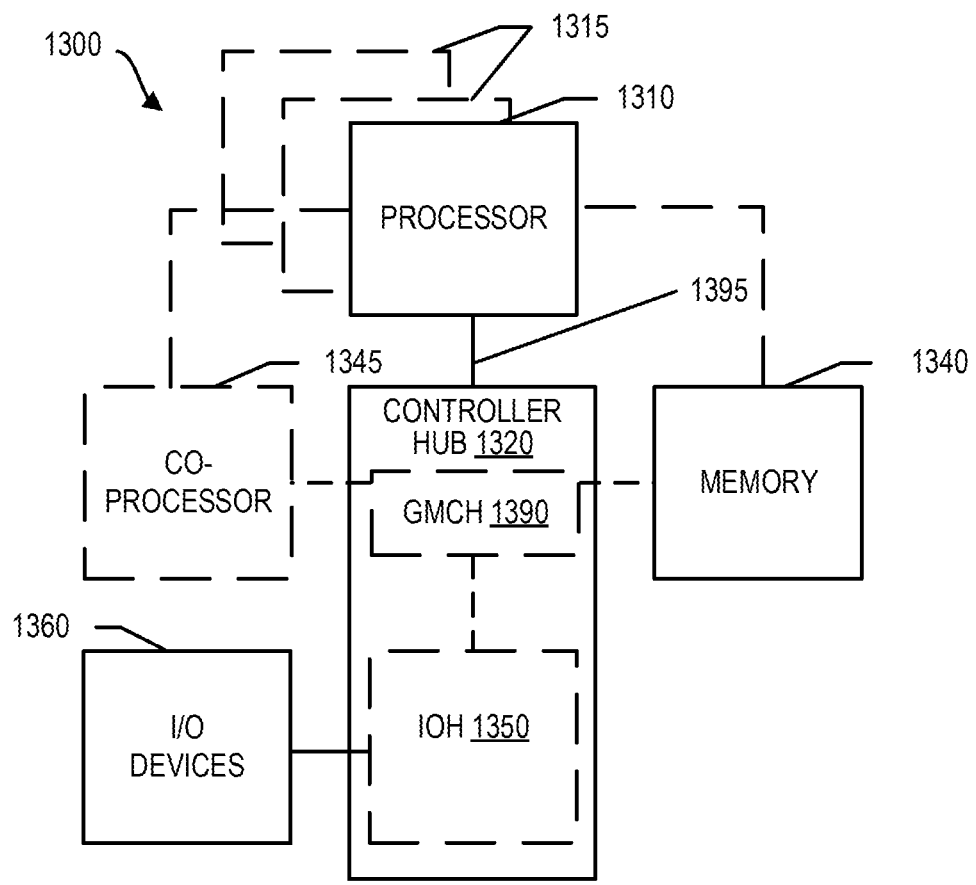
FIGS. 13-16 are block diagrams of exemplary computer architectures in accordance with certain embodiments.

Referring now to FIG. 13, shown is a block diagram of a system 1300 in accordance with at least one embodiment of the present disclosure. The system 1300 may include one or more processors 1310, 1315, which are coupled to a controller hub 1320. In one embodiment the controller hub 1320 includes a graphics memory controller hub (GMCH) 1390 and an Input/Output Hub (IOH) 1350 (which may be on separate chips); the GMCH 1390 includes memory and graphics controllers to which are coupled memory 1340 and a coprocessor 1345; the IOH 1350 couples input/output (I/O) devices 1360 to the GMCH 1390. Alternatively, one or both of the memory and graphics controllers are integrated within the processor (as described herein), the memory 1340 and the coprocessor 1345 are coupled directly to the processor 1310, and the controller hub 1320 in a single chip with the IOH 1350.

The optional nature of additional processors 1315 is denoted in FIG. 13 with broken lines. Each processor 1310, 1315 may include one or more of the processing cores described herein and may be some version of the processor 1000.

The memory 1340 may be, for example, dynamic random access memory (DRAM), phase change memory (PCM), or a combination of the two. For at least one embodiment, the controller hub 1320 communicates with the processor(s) 1310, 1315 via a multi-drop bus, such as a frontside bus (FSB), point-to-point interface such as QuickPath Interconnect (QPI), or similar connection 1395.

In one embodiment, the coprocessor 1345 is a special-purpose processor, such as, for example, a high-throughput MIC processor, a network or communication processor, compression engine, graphics processor, GPGPU, embedded processor, or the like. In one embodiment, controller hub 1320 may include an integrated graphics accelerator.

There can be a variety of differences between the physical resources 1310, 1315 in terms of a spectrum of metrics of merit including architectural, microarchitectural, thermal, power consumption characteristics, and the like.

In one embodiment, the processor 1310 executes instructions that control data processing operations of a general type. Embedded within the instructions may be coprocessor instructions. The processor 1310 recognizes these coprocessor instructions as being of a type that should be executed by the attached coprocessor 1345. Accordingly, the processor 1310 issues these coprocessor instructions (or control signals representing coprocessor instructions) on a coprocessor bus or other interconnect, to coprocessor 1345. Coprocessor(s) 1345 accept and execute the received coprocessor instructions.

Figure 14:
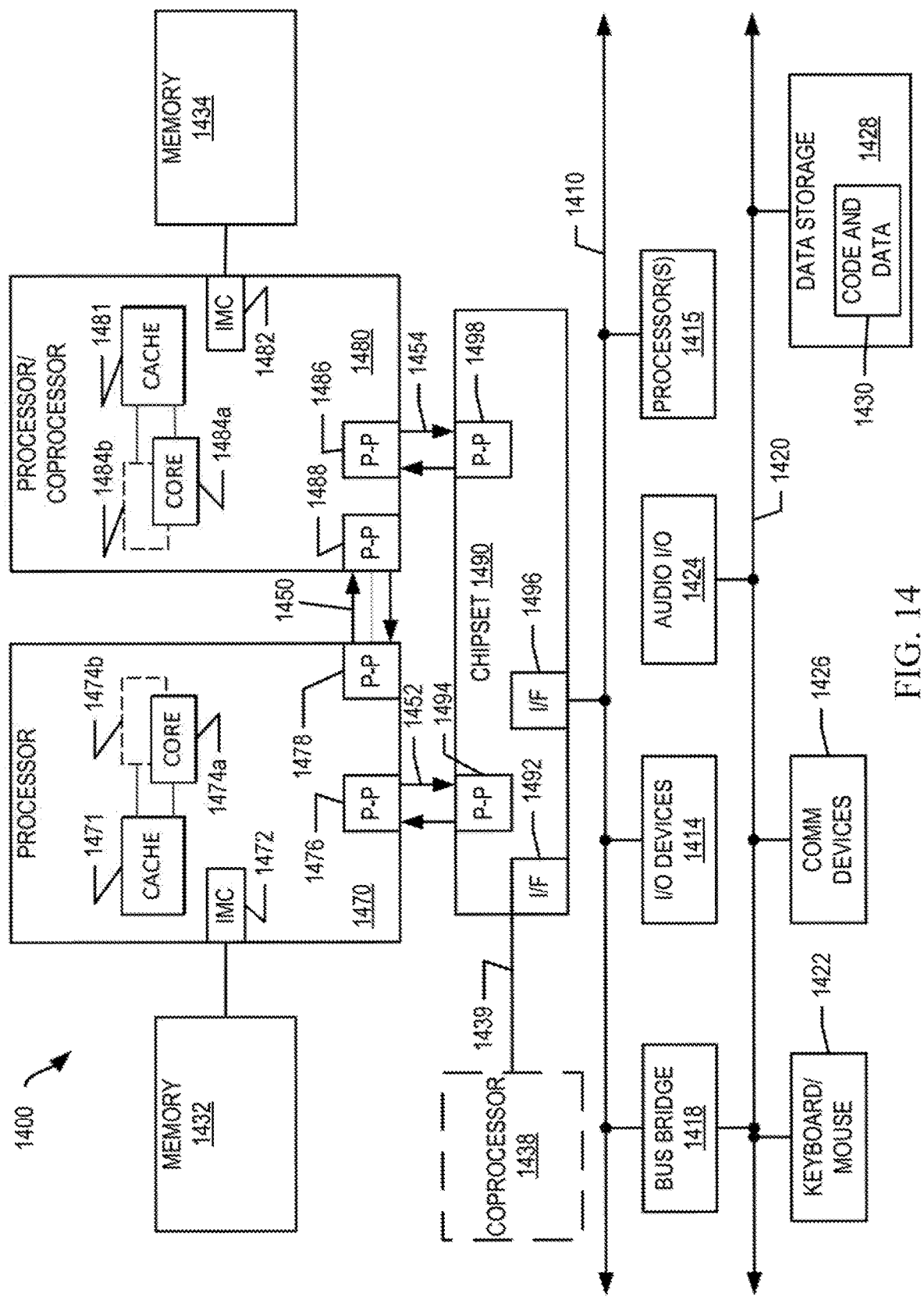

Referring now to FIG. 14, shown is a block diagram of a more specific exemplary system 1400 in accordance with one or more embodiments of the present disclosure. As shown in FIG. 14, multiprocessor system 1400 is a point-to-point interconnect system, and includes a first processor 1470 and a second processor 1480 coupled via a point-to-point interconnect 1450. Each of processors 1470 and 1480 may be some version of the processor 1200. In at least one embodiment of this disclosure, processors 1470 and 1480 are respectively processors 1310 and 1315, while coprocessor 1438 is coprocessor 1345. In another embodiment, processors 1470 and 1480 are respectively processor 1310 coprocessor 1345. In addition, processors 1470 and 1480 and their components (e.g., cores 1474*a-b* and 1484*a-b*, shared cache 1471 and 1481, memories 1432 and 1434, etc.) represent examples of processors that could be used to implement processor 210 and at least some of its components.

Processors 1470 and 1480 may each include one or more cores 1474*a-b* and 1484*a-b*. Processors 1470 and 1480 may also include integrated memory controller (IMC) units 1472 and 1482, respectively. Processor 1470 also includes as part of its bus controller units point-to-point (P-P) interfaces 1476 and 1478; similarly, second processor 1480 includes P-P interfaces 1486 and 1488. Processors 1470, 1480 may exchange information via a point-to-point (P-P) interface 1450 using P-P interface circuits 1478, 1488. As shown in FIG. 14, IMCs 1472 and 1482 couple the processors to respective memories, namely a memory 1432 and a memory 1434, which may be portions of main memory locally attached to the respective processors. Memories 1432 and/or 1434 may store various data to be used by processors 1470 and 1480 in achieving certain operations outlined herein.

Processors 1470, 1480 may each exchange information with a chipset 1490 via individual P-P interfaces 1452, 1454 using point to point interface circuits 1476, 1494, 1486, 1498. As shown herein, chipset 1490 is separated from processing elements 1470 and 1480. However, in an embodiment, chipset 1490 is integrated with processing elements 1470 and 1480. Also, chipset 1490 may be partitioned differently with fewer or more integrated circuits. Chipset 1490 may optionally exchange information with the coprocessor 1438 via a high-performance interface 1439. In one embodiment, the coprocessor 1438 is a special-purpose processor, such as, for example, a high-throughput MIC processor, a network or communication processor, compression engine, graphics processor, GPGPU, embedded processor, or the like.

A shared cache (e.g., 1471 and/or 1481) may be included in either processor or outside of both processors, yet connected with the processors via P-P interconnect, such that either or both processors' local cache information (e.g., data requested by a processor) may be stored in the shared cache if a processor is placed into a low power mode.

Chipset 1490 may be coupled to a first bus 1410 via an interface 1496. In one embodiment, first bus 1410 may be a Peripheral Component Interconnect (PCI) bus, or a bus such as a PCI Express bus or another third generation I/O interconnect bus, although the scope of the present disclosure is not so limited.

As shown in FIG. 14, various I/O devices 1414 may be coupled to first bus 1410, along with a bus bridge 1418 which couples first bus 1410 to a second bus 1420. In one embodiment, one or more additional processor(s) 1415, such as coprocessors, high-throughput MIC processors, GPGPU's, accelerators (such as, e.g., graphics accelerators or digital signal processing (DSP) units), field programmable gate arrays, or any other processor, are coupled to first bus 1410. In one embodiment, second bus 1420 may be a low pin count (LPC) bus. Various devices may be coupled to a second bus 1420 including, for example, a keyboard and/or mouse 1422 or other input devices (e.g., touch screen, trackball, joystick, etc.), communication devices 1426 (e.g., modems, network interface cards, or other types of communication devices that may communicate through a computer network), and a data storage unit 1428 such as a disk drive or other mass storage device which may include instructions/code and data 1430, in one embodiment. Further, an audio I/O 1424 may be coupled to the second bus 1420. Note that other architectures are possible. For example, instead of the point-to-point architecture of FIG. 14, a system may implement a multi-drop bus or other such architecture.

Figure 15:
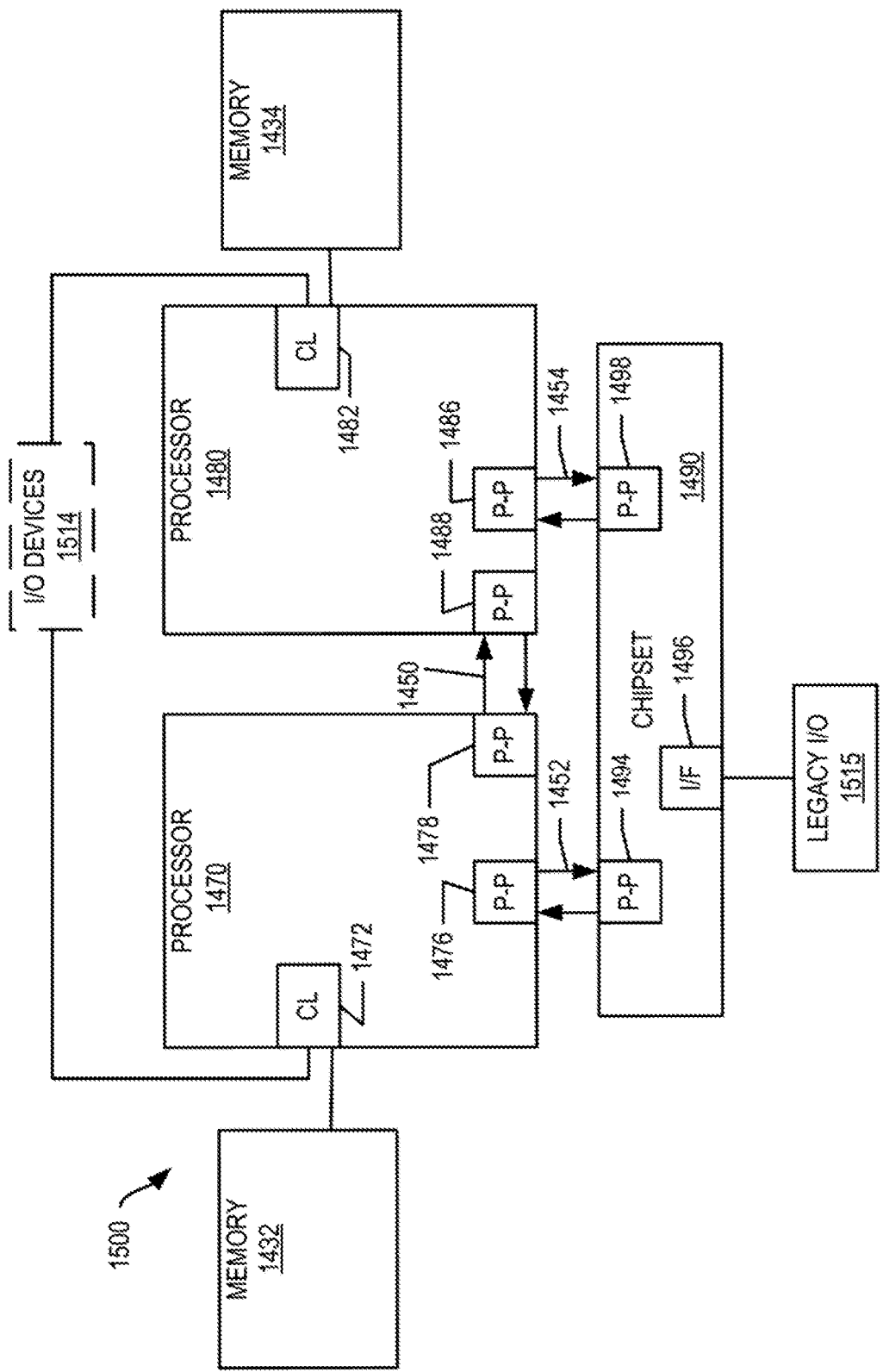

Referring now to FIG. 15, shown is a block diagram of another more specific exemplary system 1500 in accordance with at least one embodiment of the present disclosure. Like elements in FIGS. 14 and 15 bear like reference numerals, and certain aspects of FIG. 14 have been omitted from FIG. 15 in order to avoid obscuring other aspects of FIG. 15.

FIG. 15 illustrates that the processors 1470, 1480 may include integrated memory and I/O control logic ("CL") 1472 and 1482, respectively. Thus, the CL 1472, 1482 include integrated memory controller units and include I/O control logic. FIG. 15 illustrates that not only are the memories 1432, 1434 coupled to the CL 1472, 1482, but that I/O devices 1514 are also coupled to the control logic 1472, 1482. Legacy I/O devices 1515 are coupled to the chipset 1490.

Figure 16:
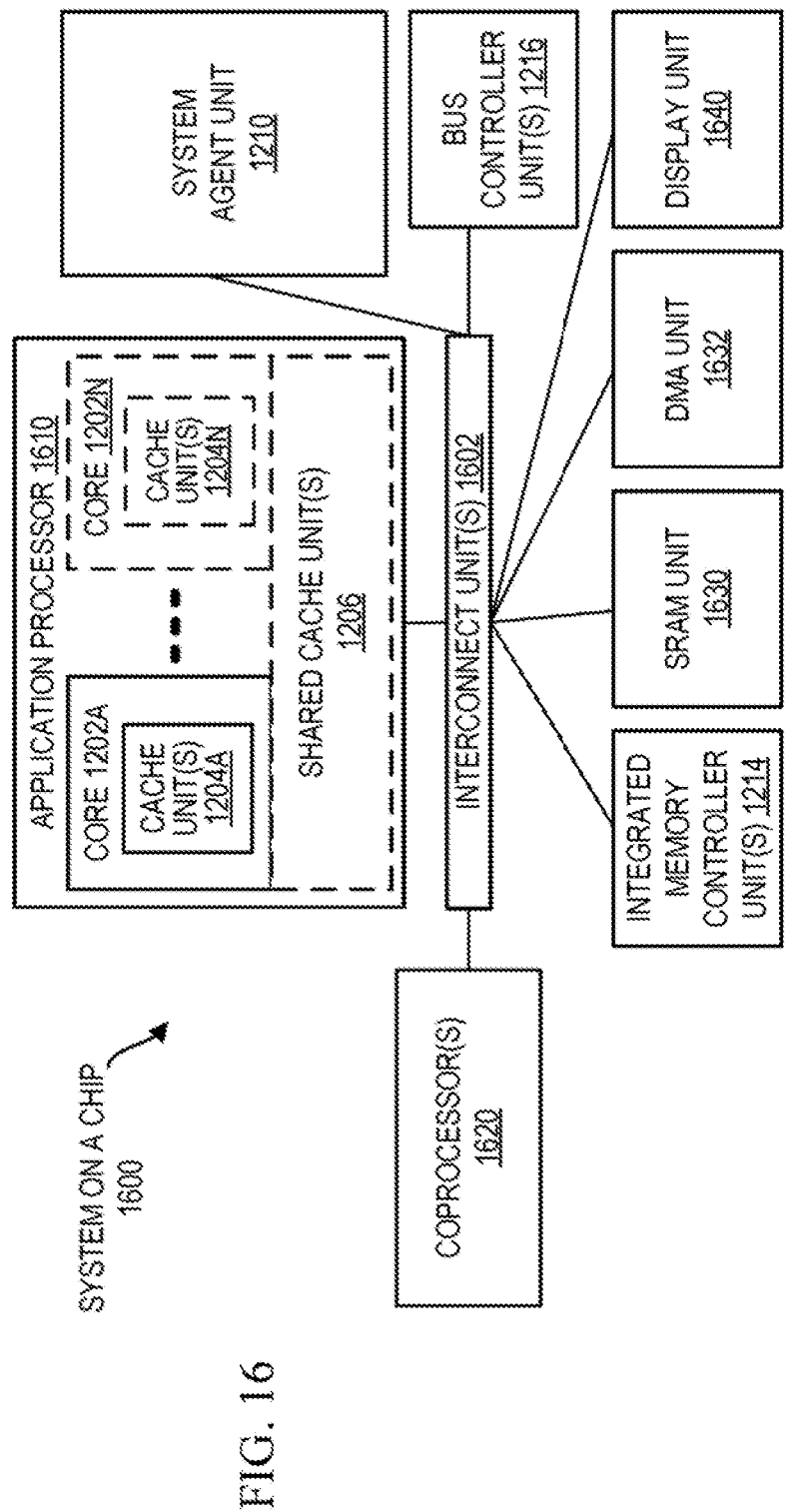

Referring now to FIG. 16, shown is a block diagram of a system on a chip (SoC) 1600 in accordance with at least one embodiment of the present disclosure. Similar elements in FIG. 12 bear like reference numerals. Also, dashed lined boxes are optional features on more advanced SoCs. In FIG. 16, an interconnect unit(s) 1602 is coupled to: an application processor 1610 which includes a set of one or more cores 1202A-N and shared cache unit(s) 1206; a system agent unit 1210; a bus controller unit(s) 1216; an integrated memory controller unit(s) 1214; a set or one or more coprocessors 1620 which may include integrated graphics logic, an image processor, an audio processor, and a video processor; an static random access memory (SRAM) unit 1630; a direct memory access (DMA) unit 1632; and a display unit 1640 for coupling to one or more external displays. In one embodiment, the coprocessor(s) 1620 includes a special-purpose processor, such as, for example, a network or communication processor, compression engine, GPGPU, a high-throughput MIC processor, embedded processor, or the like.

Embodiments of the mechanisms disclosed herein may be implemented in hardware (including microcode), software, firmware, or a combination of such implementation approaches. Embodiments of this disclosure may be implemented, at least partially, as computer programs or program code executing on programmable systems comprising at least one processor, a storage system (including volatile and non-volatile memory and/or storage elements), at least one input device, and at least one output device. Other embodiments may be implemented entirely, or almost entirely, in microcode executing on at least one processor.

Program code, such as code 1430 illustrated in FIG. 14, may be applied to input instructions to perform at least some of the functions described herein and generate output information. The output information may be applied to one or more output devices, in known fashion. For purposes of this application, a processing system includes any system that has a processor, such as, for example; a digital signal processor (DSP), a microcontroller, an application specific integrated circuit (ASIC), or a microprocessor.

The program code may be implemented in a high level procedural or object oriented programming language to communicate with a processing system. The program code may also be implemented in assembly or machine language, if desired. In fact, the mechanisms described herein are not limited in scope to any particular programming language. In any case, the language may be a compiled or interpreted language.

One or more aspects of at least one embodiment may be implemented by representative instructions stored on a machine-readable medium which represents various logic within the processor, which when read by a machine causes the machine to fabricate logic to perform the techniques described herein. Such representations, known as "IP cores" may be stored on a tangible, machine readable medium and supplied to various customers or manufacturing facilities to load into the fabrication machines that actually make the logic or processor.

Such machine-readable storage media may include, without limitation, non-transitory, tangible arrangements of articles manufactured or formed by a machine or device, including storage media such as hard disks, any other type of disk including floppy disks, optical disks, compact disk read-only memories (CD-ROMs), compact disk rewritable's (CD-RWs), and magneto-optical disks, semiconductor devices such as read-only memories (ROMs), random access memories (RAMS) such as dynamic random access memories (DRAMs), static random access memories (SRAMs), erasable programmable read-only memories (EPROMs), flash memories, electrically erasable programmable read-only memories (EEPROMs), phase change memory (PCM), magnetic or optical cards, or any other type of media suitable for storing electronic instructions.

Accordingly, embodiments of this disclosure also may include non-transitory, tangible machine-readable media containing instructions or containing design data, such as Hardware Description Language (HDL), which defines structures, circuits, apparatuses, processors and/or system features described herein. Such embodiments may also be referred to as program products.

In some cases, an instruction converter may be used to convert an instruction from a source instruction set to a target instruction set. For example, the instruction converter may translate (e.g., using static binary translation, dynamic binary translation including dynamic compilation), morph, emulate, or otherwise convert an instruction to one or more other instructions to be processed by the core. The instruction converter may be implemented in software, hardware, firmware, or a combination thereof. The instruction converter may be on processor, off processor, or part on and part off processor.

FIG. 17 is a block diagram contrasting the use of a software instruction converter to convert binary instructions in a source instruction set to binary instructions in a target instruction set according to embodiments of this disclosure. In the illustrated embodiment, the instruction converter is a software instruction converter, although alternatively the instruction converter may be implemented in software, firmware, hardware, or various combinations thereof. FIG. 17 shows a program in a high level language 1702 may be compiled using an x86 compiler 1704 to generate x86 binary code 1706 that may be natively executed by a processor with at least one x86 instruction set core 1716. The processor with at least one x86 instruction set core 1716 represents any processor that can perform substantially the same functions as an Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1704 represents a compiler that is operable to generate x86 binary code 1706 (e.g., object code) that can, with or without additional linkage processing, be executed on the processor with at least one x86 instruction set core 1716. Similarly, FIG. 17 shows the program in the high level language 1702 may be compiled using an alternative instruction set compiler 1708 to generate alternative instruction set binary code 1710 that may be natively executed by a processor without at least one x86 instruction set core 1714 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1712 is used to convert the x86 binary code 1706 into code that may be natively executed by the processor without an x86 instruction set core 1714. This converted code is not likely to be the same as the alternative instruction set binary code 1710 because an instruction converter capable of this is difficult to make; however, the converted code will accomplish the general operation and be made up of instructions from the alternative instruction set. Thus, the instruction converter 1712 represents software, firmware, hardware, or a combination thereof that, through emulation, simulation or any other process, allows a processor or other electronic device that does not have an x86 instruction set processor or core to execute the x86 binary code 1706.

Note that with the numerous examples provided herein, interaction may be described in terms of two, three, four, or more processors, logical processors, user applications, system applications, operating systems, remote action handlers, enclave mode handlers, remote action interfaces, interrupt controllers, translation lookaside buffers, enclave page caches, and/or other components. However, this has been done for purposes of clarity and example only. It should be appreciated that the system can be consolidated or divided (e.g., segmented, partitioned, separated, etc.) in any suitable manner. Along similar design alternatives, any of the illustrated microcode, logic, applications, modules, elements, processors, devices, systems, software, hardware, and other components of FIG. 2 may be combined in various possible configurations, all of which are clearly within the broad scope of this Specification. It should be appreciated that the systems of FIG. 2 (and its teachings) are readily scalable and can accommodate a large number of components, as well as more complicated/sophisticated arrangements and configurations. Accordingly, the examples provided should not limit the scope or inhibit the broad teachings of the systems as potentially applied to a myriad of other architectures.

It is also important to note that the operations in the preceding flowcharts and diagrams illustrating interactions illustrate only some of the possible operations for invalidating TLB entries while avoiding asynchronous exits that may be executed by, or within, computing system 200. Some of these operations may be deleted or removed where appropriate, or these operations may be modified or changed considerably without departing from the scope of the present disclosure. In addition, the timing of these operations may be altered considerably. For example, the timing and/or sequence of certain operations may be changed relative to other operations to be performed before, after, or in parallel to the other operations, or based on any suitable combination thereof. The preceding operational flows have been offered for purposes of example and discussion. Substantial flexibility is provided by embodiments described herein in that any suitable arrangements, chronologies, configurations, and timing mechanisms may be provided without departing from the teachings of the present disclosure.

As used herein, unless expressly stated to the contrary, use of the phrase 'at least one of' and 'one or more' of refers to any combination of the named items, elements, conditions, or activities. For example, 'at least one of X, Y, and Z' is intended to mean any of the following: 1) at least one X, but not Y and not Z; 2) at least one Y, but not X and not Z; 3) at least one Z, but not X and not Y; 4) at least one X and at least one Y, but not Z; 5) at least one X and at least one Z, but not Y; 6) at least one Y and at least one Z, but not X; or 7) at least one X, at least one Y, and at least one Z. Additionally, unless expressly stated to the contrary, the numbering adjectives 'first', 'second', 'third', etc., are intended to distinguish the particular terms (e.g., element, condition, module, activity, operation, claim element, etc.) they precede, but are not intended to indicate any type of order, rank, importance, temporal sequence, or hierarchy of the modified term. For example, 'first X' and 'second X' are intended to designate two separate X elements that are not necessarily limited by any order, rank, importance, temporal sequence, or hierarchy of the two elements. Also, references in the specification to "one embodiment," "an embodiment," "some embodiments," etc., indicate that the embodiment(s) described may include a particular feature, structure, or characteristic, but every embodiment may or may not necessarily include that particular feature, structure, or characteristic. Moreover, such phrases are not necessarily referring to the same embodiment.

While this specification contains many specific implementation details, these should not be construed as limitations on the scope of any embodiments or of what may be claimed, but rather as descriptions of features specific to particular embodiments of the subject matter disclosed herein. Certain features that are described in this specification in the context of separate embodiments can also be implemented in combination in a single embodiment. For example, invalidating TLB entries while avoiding asynchronous exits may be implemented as previously described herein, and in other ways that may not be specifically outlined herein. Conversely, various features that are described in the context of a single embodiment may also be implemented in multiple embodiments separately or in any suitable sub combination. Moreover, although features may be described above as acting in certain combinations and even initially claimed as such, one or more features from a claimed combination can in some cases be excised from the combination, and the claimed combination may be directed to a sub combination or variation of a sub combination.

Numerous other changes, substitutions, variations, alterations, and modifications may be ascertained to one skilled in the art and it is intended that the present disclosure encompass all such changes, substitutions, variations, alterations, and modifications as falling within the scope of the appended claims.

OTHER NOTES AND EXAMPLES

The following examples pertain to embodiments in accordance with this specification. Example A1 provides an apparatus for avoiding an asynchronous exit from an enclave mode, the apparatus comprising a memory element to store a payload indicating an action to be performed associated with a remote action request (RAR) and a remote action handler circuit of a logical processor to: identify the action to be performed, the action including invalidating one or more entries of a translation lookaside buffer (TLB); determine that the logical processor entered the enclave mode during a prior epoch; perform one or more condition checks on control and state pages associated with the enclave mode; and based on results of the one or more condition checks, adjust one or more variables associated with the logical processor to simulate the logical processor re-entering the enclave mode.

In Example A2, the subject matter of Example A1 can optionally include where the remote action handler circuit is to further invalidate an entry of the TLB based, at least in part, on the results of the one or more condition checks, where the entry to be invalidated includes a page address within an enclave address range of memory.

In Example A3, the subject matter of Example A2 can optionally include where the page address included in the entry of the TLB is omitted from the RAR.

In Example A4, the subject matter of any one of Examples A1-A3 can optionally include where the remote action handler circuit is to further invalidate the one or more entries of the TLB, where the RAR indicates one or more page addresses included in the one or more entries of the TLB, respectively, and where the one or more page addresses are within an enclave address range of memory.

In Example A5, the subject matter of any one of Examples A1-A4 can optionally include where the remote action handler circuit is to further determine that the logical processor is running in the enclave mode and that one or more page addresses indicated by the RAR are within an enclave address range.

In Example A6, the subject matter of any one of Examples A1-A5 can optionally include where the prior epoch is a period during which a prior value was assigned to a global epoch variable.

In Example A7, the subject matter of any one of Examples A1-A6 can optionally include where the results indicate that the control and state pages associated with the enclave mode are unmodified, unblocked and otherwise accessible to the logical processor.

In Example A8, the subject matter of any one of Examples A1-A7 can optionally include where the control page includes meta information related to a thread running on the logical processor.

In Example A9, the subject matter of any one of Examples A1-A8 can optionally include where at least one state page includes context information associated with a state of the logical processor.

In Example A10, the subject matter of any one of Examples A1-A9 can optionally include where the one or more variables include an enclave entry epoch variable and one or more enclave reference counters.

In Example A11, the subject matter of Example A10 can optionally include where adjusting the enclave entry epoch variable includes setting the enclave entry epoch variable to a current value of a global epoch variable.

In Example A12, the subject matter of any one of Examples A10-A11 can optionally include where adjusting the one or more enclave reference counters includes incrementing a first enclave reference counter for a current epoch by one and decrementing a second enclave reference counter for the prior epoch by one.

In Example A13, the subject matter of any one of Examples A10-A12 can optionally include where, prior to adjusting the enclave entry epoch variable, the remote action handler circuit is to further: obtain a current value of the enclave entry epoch variable; obtain a current value of a global epoch variable; and determine the logical processor entered the enclave mode during the prior epoch based on a comparison of the current value of the enclave entry epoch variable and the current value of the global epoch variable.

In Example A14, the subject matter of any one of Examples A1-A13 can optionally include where the RAR is associated with one of an inter-processor interrupt (IPI) or a RAR signal.

In Example A15, the subject matter of any one of Examples A1-A14 can optionally include where the memory includes an enclave page cache that stores one or more pages at one or more page addresses corresponding to the one or more TLB entries.

The following examples pertain to embodiments in accordance with this specification. Example S1 provides a system for avoiding an asynchronous exit from an enclave mode, the system comprising a memory and a processor coupled to the memory, the processor including a remote action interface circuit comprising microcode to: identify a received remote action request (RAR) associated with an action to be performed including invalidating one or more entries of a translation lookaside buffer (TLB); determine that the logical processor entered the enclave mode during a prior epoch; perform one or more condition checks on control and state pages associated with the enclave mode; and based on results of the one or more condition checks, adjust one or more variables associated with the logical processor to simulate the logical processor re-entering the enclave mode.

In Example S2, the subject matter of Example S1 can optionally include where the microcode is to further invalidate an entry of the TLB based, at least in part, on the results of the one or more condition checks, where the entry to be invalidated includes a page address within an enclave address range of memory.

In Example S3, the subject matter of Example S2 can optionally include where the page address included in the entry of the TLB is omitted from the RAR.

In Example S4, the subject matter of any one of Examples S1-53 can optionally include where the microcode is to further invalidate the one or more entries of the TLB, where the RAR indicates one or more page addresses included in the one or more entries of the TLB, respectively, and where the one or more page addresses are within an enclave address range of memory.

In Example S5, the subject matter of any one of Examples S1-54 can optionally include where the microcode is to further determine that the logical processor is running in the enclave mode and that one or more page addresses indicated by the RAR are within an enclave address range.

In Example S6, the subject matter of any one of Examples S1-55 can optionally include where the prior epoch is a period during which a prior value was assigned to a global epoch variable.

In Example S7, the subject matter of any one of Examples S1-56 can optionally include where the results indicate that the control and state pages associated with the enclave mode are unmodified, unblocked and otherwise accessible to the logical processor.

In Example S8, the subject matter of any one of Examples S1-57 can optionally include where the control page includes meta information related to a thread running on the logical processor.

In Example S9, the subject matter of any one of Examples S1-S8 can optionally include where at least one state page includes context information associated with a state of the logical processor.

In Example S10, the subject matter of any one of Examples S1-S9 can optionally include where the one or more variables include an enclave entry epoch variable and one or more enclave reference counters.

In Example S11, the subject matter of Example S10 can optionally include where adjusting the enclave entry epoch variable includes setting the enclave entry epoch variable to a current value of a global epoch variable.

In Example S12, the subject matter of any one of Examples S10-S11 can optionally include where adjusting the one or more enclave reference counters includes incrementing a first enclave reference counter for a current epoch by one and decrementing a second enclave reference counter for the prior epoch by one.

In Example S13, the subject matter of any one of Examples S1-S12 can optionally include where, prior to adjusting the enclave entry epoch variable, the microcode is to further: obtain a current value of the enclave entry epoch variable; obtain a current value of a global epoch variable; and determine the logical processor entered the enclave mode during the prior epoch based on a comparison of the current value of the enclave entry epoch variable and the current value of the global epoch variable.

In Example S14, the subject matter of any one of Examples S1-S13 can optionally include where the RAR is associated with one of an inter-processor interrupt (IPI) or a RAR signal.

In Example S15, the subject matter of any one of Examples S1-S14 can optionally include where the memory includes an enclave page cache that stores one or more pages at one or more page addresses corresponding to the one or more TLB entries.

The following examples pertain to embodiments in accordance with this specification. Example M1 provides a method, an apparatus, a system, one or more machine readable mediums, and/or hardware-, firmware-, and/or software-based logic, where the Example of M1 comprises: identifying an action to be performed associated with a remote action request (RAR), the action including invalidating one or more entries of a translation lookaside buffer (TLB); determining that the logical processor entered an enclave mode during a prior epoch; performing one or more condition checks on control and state pages associated with the enclave mode; and based on results of the one or more condition checks, adjusting one or more variables associated with the logical processor to simulate the logical processor re-entering the enclave mode.

In Example M2, the subject matter of Example M1 can optionally include invalidating an entry of the TLB based, at least in part, on the results of the one or more condition checks, where the entry to be invalidated includes a page address within an enclave address range of memory.

In Example M3, the subject matter of Example M2 can optionally include where the page address included in the entry of the TLB is omitted from the RAR.

In Example M4, the subject matter of any one of Examples M1-M3 can optionally include invalidating the one or more entries of the TLB, where the RAR indicates one or more page addresses included in the one or more entries of the TLB, respectively, and where the one or more page addresses are within an enclave address range of memory.

In Example M5, the subject matter of any one of Examples M1-M4 can optionally include determining that the logical processor is running in the enclave mode and that one or more page addresses indicated by the RAR are within an enclave address range.

In Example M6, the subject matter of any one of Examples M1-M5 can optionally include where the prior epoch is a period during which a prior value was assigned to a global epoch variable.

In Example M7, the subject matter of any one of Examples M1-M6 can optionally include where the results indicate that the control and state pages associated with the enclave mode are unmodified, unblocked and otherwise accessible to the logical processor.

In Example M8, the subject matter of any one of Examples M1-M7 can optionally include where the control page includes meta information related to a thread running on the logical processor.

In Example M9, the subject matter of any one of Examples M1-M8 can optionally include where at least one state page includes context information associated with a state of the logical processor.

In Example M10, the subject matter of any one of Examples M1-M9 can optionally include where the one or more variables include an enclave entry epoch variable and one or more enclave reference counters.

In Example M11, the subject matter of Example M10 can optionally include where adjusting the enclave entry epoch variable includes setting the enclave entry epoch variable to a current value of a global epoch variable.

In Example M12, the subject matter of any one of Examples M10-M11 can optionally include where adjusting the one or more enclave reference counters includes incrementing a first enclave reference counter for a current epoch by one and decrementing a second enclave reference counter for the prior epoch by one.

In Example M13, the subject matter of any one of Examples M1-M12 can optionally include where, prior to adjusting the enclave entry epoch variable, the method further comprises: obtaining a current value of the enclave entry epoch variable; obtaining a current value of a global epoch variable; and determining the logical processor entered the enclave mode during the prior epoch based on a comparison of the current value of the enclave entry epoch variable and the current value of the global epoch variable.

In Example M14, the subject matter of any one of Examples M1-M13 can optionally include where the RAR is associated with one of an inter-processor interrupt (IPI) or a RAR signal.

In Example M15, the subject matter of any one of Examples M1-M14 can optionally include where the memory includes an enclave page cache that stores one or more pages at one or more page addresses corresponding to the one or more TLB entries.

Example X1 provides an apparatus for avoiding an asynchronous exit from an enclave mode, where the apparatus comprises means for performing the method of any one of the preceding Examples.

In Example X2, the subject matter of Example X1 can optionally include that the means for performing the method comprises at least one processor and at least one memory element.

In Example X3, the subject matter of Example X2 can optionally include that the at least one memory element comprises machine readable instructions that when executed, cause the apparatus to perform the method of any one of the preceding Examples.

In Example X4, the subject matter of any one of Examples X1-X3 can optionally include that the apparatus is one of a computing system, a processing element, or a system-on-a-chip.

Example X5 provides at least one machine readable storage medium comprising instructions for invalidating translation lookaside buffer (TLB) entries, where the instructions when executed realize an apparatus, realize a system, or implement a method as in any one of the preceding Examples.

What is claimed is:

1. An apparatus, the apparatus comprising:
   a memory element to store a payload indicating an action to be performed associated with a remote action request (RAR); and
   a remote action handler circuit of a logical processor to:
      identify the action to be performed, the action including invalidating one or more entries of a translation lookaside buffer (TLB);
      determine that the logical processor is running in an enclave mode;
      based on determining that the logical processor entered the enclave mode during a prior epoch of an enclave, perform one or more condition checks on control and state pages associated with the enclave; and
      based on results of the one or more condition checks, adjust one or more variables associated with the logical processor to simulate the logical processor re-entering the enclave mode, wherein adjusting the one or more variables is to include setting a first variable to indicate that the logical processor entered the enclave mode during a current epoch of the enclave.

2. The apparatus of claim 1, wherein the remote action handler circuit is to further:
   invalidate an entry of the TLB based, at least in part, on the results of the one or more condition checks, wherein the entry to be invalidated includes a page address within an enclave address range of memory.

3. The apparatus of claim 2, wherein the page address included in the entry of the TLB is omitted from the RAR.

4. The apparatus of claim 1, wherein the remote action handler circuit is to further:
   invalidate the one or more entries of the TLB, wherein the RAR indicates one or more page addresses included in the one or more entries of the TLB, respectively, and wherein the one or more page addresses are within an enclave address range of memory.

5. The apparatus of claim 1, wherein the remote action handler circuit is to further:
   determine that one or more page addresses indicated by the RAR are within an enclave address range.

6. The apparatus of claim 1, wherein the prior epoch corresponds to a first period of the enclave during which the one or more entries of the TLB were not invalidated and a prior value was assigned to a global epoch variable.

7. The apparatus of claim 1, wherein the results indicate that the control and state pages associated with the enclave mode are unmodified, unblocked and otherwise accessible to the logical processor.

8. The apparatus of claim 1, wherein the control page includes meta information related to a thread running on the logical processor.

9. The apparatus of claim 1, wherein at least one state page includes context information associated with a state of the logical processor.

10. The apparatus of claim 1, wherein the one or more variables include one or more enclave reference counters.

11. The apparatus of claim 10, wherein the setting the first variable to indicate that the logical processor entered the enclave mode during the current epoch includes assigning a current value of a global epoch variable to the first variable.

12. The apparatus of claim 10, wherein adjusting the one or more enclave reference counters includes:
   incrementing a first enclave reference counter for the current epoch by one; and
   decrementing a second enclave reference counter for the prior epoch by one.

13. The apparatus of claim 10, wherein, prior to the setting the first variable, the remote action handler circuit is to further:
   determine the logical processor entered the enclave mode during the prior epoch based on a comparison of a current value of the first variable and a current value of a global epoch variable.

14. The apparatus of claim 1, wherein the RAR is associated with one of an inter-processor interrupt (IPI) or a RAR signal.

15. A system comprising:
   a memory; and
   a logical processor coupled to the memory and including a remote action interface circuit comprising microcode to:
      identify a received remote action request (RAR) associated with an action to be performed including invalidating one or more entries of a translation lookaside buffer (TLB);
      determine that the logical processor is running in an enclave mode;
      based on determining that the logical processor entered the enclave mode during a prior epoch of an enclave, perform one or more condition checks on control and state pages of the enclave; and
      based on results of the one or more condition checks, adjust one or more variables associated with the logical processor to simulate the logical processor re-entering the enclave mode, wherein adjusting the one or more variables is to include setting a first variable to indicate that the logical processor entered the enclave mode during a current epoch of the enclave.

16. The system of claim 15, wherein the microcode is to further:
   invalidate an entry of the TLB based, at least in part, on the results of the one or more condition checks, wherein the entry to be invalidated includes a page address within an enclave address range of the memory.

17. The system of claim 15, wherein the microcode is to further:
   determine that one or more page addresses indicated by the RAR are within an enclave address range.

18. The system of claim 15, wherein the results indicate that the control and state pages associated with the enclave mode are unmodified, unblocked and otherwise accessible to the logical processor.

19. The system of claim 15, wherein the control page includes meta information related to a thread running on the logical processor.

20. The system of claim 15, wherein at least one state page includes context information associated with a state of the logical processor.

21. The system of claim 15, wherein the memory includes an enclave page cache that stores one or more pages at one or more page addresses corresponding to the one or more entries of the TLB.

22. A method, the method comprising:
   identifying, by a logical processor, an action to be performed associated with a received remote action request (RAR), the action including invalidating one or more entries of a translation lookaside buffer (TLB);
   determining that the logical processor is running in an enclave mode;

based on the determining that the logical processor entered the enclave mode during a prior epoch of an enclave, performing one or more condition checks on control and state pages of the enclave; and based on results of the one or more condition checks, adjusting one or more variables associated with the logical processor to simulate the logical processor re-entering the enclave mode, wherein the adjusting the one or more variables includes setting a first variable to indicate that the logical processor entered the enclave mode during a current epoch of the enclave.

23. The method of claim 22, further comprising:

invalidating an entry of the TLB based, at least in part, on the results of the one or more condition checks, wherein the entry to be invalidated includes a page address within an enclave address range of memory.

24. The method of claim 22, further comprising:

determining that one or more page addresses specified in the RAR are within an enclave address range.

25. The method of claim 22, wherein the RAR is associated with one of an inter-processor interrupt (IPI) or a RAR signal.

* * * * *